(12) United States Patent
Li et al.

(10) Patent No.: US 12,044,533 B2
(45) Date of Patent: Jul. 23, 2024

(54) METHODS AND APPARATUS FOR PLANAR MAGNETOMETER CALIBRATION, HEADING DETERMINATION, GYROSCOPE ASSISTED MAGNETOMETER AMPLITUDE CALIBRATION, MAGNETOMETER AMPLITUDE AND ALIGNMENT CALIBRATION, MAGNETOMETER MAPPING, AND SENSOR FUSION

(71) Applicant: CEVA TECHNOLOGIES, INC., Mountain View, CA (US)

(72) Inventors: Yun Li, Mountain View, CA (US); Bryan A. Cook, Silver Spring, MD (US); Chao Wu, Clarksville, MD (US)

(73) Assignee: CEVA TECHNOLOGIES, INC., Mountain View, CA (US)

( * ) Notice: Subject to any disclaimer, the term of this patent is extended or adjusted under 35 U.S.C. 154(b) by 970 days.

(21) Appl. No.: 16/971,120

(22) PCT Filed: Feb. 21, 2019

(86) PCT No.: PCT/US2019/018948
§ 371 (c)(1),
(2) Date: Aug. 19, 2020

(87) PCT Pub. No.: WO2019/168735
PCT Pub. Date: Sep. 6, 2019

(65) Prior Publication Data
US 2021/0095966 A1    Apr. 1, 2021

Related U.S. Application Data

(60) Provisional application No. 62/639,746, filed on Mar. 7, 2018, provisional application No. 62/636,441, filed
(Continued)

(51) Int. Cl.
*G01C 21/20* (2006.01)
*G01C 17/28* (2006.01)
(Continued)

(52) U.S. Cl.
CPC ............. *G01C 21/20* (2013.01); *G01C 17/28* (2013.01); *G01C 17/38* (2013.01); *G01C 19/00* (2013.01); *G01P 15/08* (2013.01); *G01P 15/18* (2013.01)

(58) Field of Classification Search
CPC ................................ G01C 21/20; G01C 17/28
(Continued)

(56) References Cited

U.S. PATENT DOCUMENTS 7,158,118 B2    1/2007    Liberty
7,262,760 B2    8/2007    Liberty
(Continued)

FOREIGN PATENT DOCUMENTS

WO    2010002997 A1    1/2010

OTHER PUBLICATIONS

International Search Report/Written Opinion in related/corresponding PCT Application No. PCT/US2019/018948 dated Feb. 21, 2019.
(Continued)

*Primary Examiner* — Ricky Go
(74) *Attorney, Agent, or Firm* — PATENT PORTFOLIO BUILDERS PLLC

(57) ABSTRACT

Methods, apparatus, and systems directed to calibrating a magnetometer. Among such are methods that use only the horizontal components of magnetometer measurements. Then, planar calibrated magnetic field output measurements can be used in sensor fusion with data from gyroscope(s) and accelerometer(s). In other embodiments, heading information from the planar calibrated magnetic field is fused with
(Continued)

the heading calculated from gyroscope integration. Other such methods include any of generating combined information including 6-axis fusion information and magnetometer information; accumulating values for any of a first matrix [T] and a first vector [U] according to the combined information; generating a second matrix $[\hat{K}]$ according to any of a pseudo-inverse of the first matrix [T] and the first vector [U]; generating any of a scale and skew matrix and an offset according to the first matrix $[\hat{K}]$; and calibrating the magnetometer according to any of the scale and skew matrix and the offset.

18 Claims, 13 Drawing Sheets

Related U.S. Application Data on Feb. 28, 2018, provisional application No. 62/642,577, filed on Mar. 13, 2018.

(51) Int. Cl.
    *G01C 17/38*    (2006.01)
    *G01C 19/00*    (2013.01)
    *G01P 15/08*    (2006.01)
    *G01P 15/18*    (2013.01)

(58) Field of Classification Search
    USPC .......................................................... 702/92
    See application file for complete search history.

(56) References Cited

U.S. PATENT DOCUMENTS

| | | | |
|---|---|---|---|
| 7,414,611 B2 | 8/2008 | Liberty | |
| 8,548,766 B2* | 10/2013 | Judd | G01C 25/00 |
| | | | 702/92 |
| 9,482,554 B2 | 11/2016 | Cook et al. | |
| 2009/0259432 A1 | 10/2009 | Liberty et al. | |
| 2013/0174636 A1 | 7/2013 | Joseph | |
| 2013/0185018 A1 | 7/2013 | Sheng | |
| 2013/0238268 A1* | 9/2013 | Sheng | G01C 17/38 |
| | | | 702/92 |
| 2013/0245984 A1 | 9/2013 | Sheng | |
| 2015/0177020 A1* | 6/2015 | An | G01P 21/00 |
| | | | 702/92 |
| 2016/0187155 A1* | 6/2016 | Askarpour | G01C 21/20 |
| | | | 701/33.1 |
| 2016/0334219 A1* | 11/2016 | Askarpour | G01C 23/00 |

OTHER PUBLICATIONS

L. Lovisolo et al., "Uniform distribution of points on a hyper-sphere with applications to vector bit-plane encoding," IEEE Proceedings—Vision Image Signal Processing, Jun. 2001, pp. 187-193, vol. 148, No. 3.

Office Action in related/corresponding Japanese Application No. 2020-568664 dated Sep. 20, 2022.

Decision to Grant in related/corresponding Japanese Application No. 2020-568664 dated Nov. 7, 2022.

Office Action in related/corresponding European Application No. 19 710 200.7 dated Feb. 7, 2023.

Office Action in related/corresponding Korean Application No. 10-2020-7027929 dated Sep. 12, 2023.

\* cited by examiner

METHODS AND APPARATUS FOR PLANAR MAGNETOMETER CALIBRATION, HEADING DETERMINATION, GYROSCOPE ASSISTED MAGNETOMETER AMPLITUDE CALIBRATION, MAGNETOMETER AMPLITUDE AND ALIGNMENT CALIBRATION, MAGNETOMETER MAPPING, AND SENSOR FUSION

BACKGROUND

It is becoming increasingly more common and widespread for electronic devices, especially mobile devices such as cellular telephones, digital cameras, GPS units, laptop and palmtop computers, to include so-called nine-axis sensors to provide enhanced functionality to the device. They are referred to as being nine-axis because they include one gyroscope, one accelerometer, and one magnetometer for each of three orthogonal directions, comprising a total of nine sensors. A chip or other electronic component having such motion sensors is commonly referred to as an IMU or Inertial Motion Unit. The 3-D gyroscopes measure angular velocities. The 3-D accelerometers measure linear acceleration. The magnetometers measure a local magnetic field vector (or a deviation thereof). Despite their popularity, the capabilities of these nine-axis sensors are not fully exploited due to, among other things, the difficulty of calibrating and removing undesirable effects from the sensors. For instance, gyroscope tend to be subject to the well-known phenomenon known as zero-rate offset (ZRO) in which their output is non-zero (indicating rotation) when the gyroscope, in fact, is not rotating. Magnetometers suffer from several different well-known noise factors, such as near field interference, soft iron effects, and hard iron effects.

A rigid body's (rigid body designating any device to which the magnetometer and motion sensors are rigidly attached) 3-D angular position with respect to an Earth-fixed gravitational orthogonal reference system is uniquely defined. When a magnetometer and an accelerometer are used, it is convenient to define the gravitational reference system as having the positive Z-axis along gravity, the positive X-axis pointing to magnetic North and the positive Y-axis pointing East. The accelerometer senses gravity, and, hence, can be used to define the Z-axis. The magnetometer senses the earth's magnetic field, and, hence, can be used to define the X-axis (although it is known that the angle between the Earth's magnetic field and gravity may be different from 90°). This manner of defining the axis of a gravitational reference system is not intended to be limiting. Other definitions of an orthogonal right-hand reference system may be derived based on the two known directions, gravity and the magnetic North.

Motion sensors attached to the 3-D body measure its position (or change thereof) in a body orthogonal reference system defined relative to the 3-D body. For example, as illustrated in FIG. 1 for an aircraft, without loss of generality, the body reference system has the positive X-axis pointing forward along the aircraft's longitudinal axis, the positive Y-axis is directed along the right wing and the positive Z-axis is determined considering a right-hand orthogonal reference system (right hand rule). If the aircraft flies horizontally, the positive Z-axis aligns to the gravitational system's Z-axis, along the direction of gravity, and the roll and pitch in the gravitational reference system can be determined using a 3-D accelerometer and a 2 or 3-D rotational sensors attached to the body and based on the gravity's known direction (see, e.g., Liberty U.S. Pat. Nos. 7,158,118, 7,262,760 and 7,414,611).

Based on Euler's theorem, the body reference system and the gravitational reference system (as two orthogonal right-hand coordinate systems) can be related by a sequence of rotations (not more than three) about coordinate axes, where successive rotations are about different axis. A sequence of such rotations is known as a Euler angle-axis sequence. Such a reference rotation sequence is illustrated in FIG. 2. The angles of these rotations are angular positions of the device in the gravitational reference system.

A 3-D magnetometer measures a 3-D magnetic field representing an overlap of (1) a 3-D static magnetic field (e.g., Earth's magnetic field), (2) hard-iron effects, (3) soft-iron effects, and (4) a 3-D dynamic near field due to external time-dependent electro-magnetic fields (e.g., electromagnetic noise from other electronic devices nearby). The measured magnetic field depends on the actual orientation of the magnetometer. If the hard-iron effects, soft-iron effects, and dynamic near fields were zero, the locus of the measured magnetic field (as the magnetometer is oriented in different directions) would be a sphere of radius equal to the magnitude of the Earth's magnetic field. The non-zero hard- and soft-iron effects render the locus of the measured magnetic field to be an ellipsoid offset from origin.

Hard-iron effect is produced by materials that exhibit a constant magnetic field overlapping the Earth's magnetic field, thereby generating constant offsets of the components of the measured magnetic field. As long as the orientation and position of the sources of magnetic field due to the hard-iron effects relative to the magnetometer is constant, the corresponding offsets are also constant.

Unlike the hard-iron effect that yields a magnetic field overlapping the Earth's field, the soft-iron effect is the result of material that influences, or distorts, a magnetic field (such as, iron and nickel), but does not necessarily generate a magnetic field itself. Therefore, the soft-iron effect is a distortion of the measured field depending upon the location and characteristics of the material causing the effect relative to the magnetometer and to the Earth's magnetic field. Thus, soft-iron effects cannot be compensated with simple offsets, requiring a more complicated procedure.

The magnetic near fields are dynamic distortions of a measured magnetic field due to time-dependent magnetic fields.

It is known in the relevant arts to use the data from some of the sensors (e.g., the gyroscopes) to estimate and compensate for the error in others of the sensors (e,g., the magnetometers). This is often referred to as sensor fusion and there are numerous sensor fusion techniques. For example, to compute an orientation and/or an attitude (which may include computing any of a yaw, a roll, or a pitch angle) of a device (such as a mobile and/or handheld electronic device) a sensor fusion algorithm may fuse data from more than one input, such as sensors including any of a gyroscope, accelerometer, and magnetometer. A sensor may work (e.g., may operate, may be configured, may perform operations, etc.) under certain conditions (e.g., assumptions, configurations, etc.). For example, a magnetometer may operate under the assumption that a magnetic field surrounding a device (e.g., surrounding an area of motion of the device) is a constant vector field. However, when such an assumption is not true, an incorrect and/or imperfect magnetometer calibration may occur.

In sensor fusion algorithms with IMU data (gyroscope, accelerometer, and magnetometer), heading information (i.e., orientation of the device) is available from two sources, the gyroscope data and the magnetometer data. When the gyroscope is calibrated accurately, the gyroscope integration can give a smooth and accurate orientation change from a starting orientation. However, a gyroscope cannot determine the starting orientation and it also suffers from a long-term drift caused by the residue ZRO. However, the starting orientation (as well as at any other time) can be known from the magnetometers. However, magnetometers are noisy and affected by interference that changes over time. Nevertheless, if calibrated correctly, magnetometers can provide a reasonably accurate reading of true north direction with little to no drift. These two sources of heading information are then fused in a sensor fusion algorithm to provide an orientation, including the heading, of the device. Therefore, long term heading performance relies heavily on the accuracy of the magnetometer calibration.

U.S. Patent Application Publication No. 2013/0238268 discloses some example magnetometer calibration algorithms.

The body frame magnetic field measured by the sensors of an IMU on the device as it moves and rotates through different orientations forms an ellipsoid in 3D space. The calibration algorithm finds the parameters of the ellipsoid (e.g., offset, scale, skew) that best fit with the magnetic field measurement at different orientations. To get a good fit, the measurement data should cover a large part of the ellipsoid. A typical motion for magnetometer calibration is the so-called figure ∞ motion, in which the orientation of a handheld device changes by twisting the wrist, like writing a figure Do in the air using the leading edge or tip of the device. See, e.g., https://www.youtube.com/watch?v=sP3d00Hr14o. After a good calibration was found, it can be used to provide heading, until the magnetometer environment is changed, then a new calibration is needed.

However, some applications naturally do not have enough motion to cover a large ellipsoid space. For example, a robotic vacuum cleaner (RVC) mostly rotates in a single plane (the plane perpendicular to gravity), so the measured magnetic field will be an ellipse in the horizontal plane. Another example is when the device is mounted in a car, which, like a vacuum cleaner will rotate almost exclusively around the gravitational axis, with perhaps some small tilt. For these cases, the regular 3D magnetometer calibration cannot find a solution, and the magnetometer may never be fully calibrated.

SUMMARY

According to embodiments, a planar magnetic calibration is performed using only the horizontal components of magnetometer measurements. Then, the planar calibrated magnetic field output measurements can be used in sensor fusion with the data from the gyroscope(s) and accelerometer(s) to provide a more accurate calibrated heading reading. In other embodiments, the heading information from the planar calibrated magnetic field can be fused with the heading calculated from gyroscope integration.

BRIEF DESCRIPTION OF THE DRAWINGS

A more detailed understanding may be had from the detailed description below, given by way of example in conjunction with drawings appended hereto. Figures in the description, are examples. As such, the Figures and the detailed description are not to be considered limiting, and other equally effective examples are possible and likely. Furthermore, like reference numerals in the figures indicate like elements, and wherein.

DETAILED DESCRIPTION

1. Introduction

The following description of exemplary embodiments refers to the accompanying drawings. The following detailed description does not limit the invention. Instead, the scope of the invention is defined by the appended claims. The following embodiments are discussed, for simplicity, with regard to the terminology and structure of a sensing unit including motion sensors and a magnetometer attached to a rigid 3-D body ("the device"). However, the embodiments to be discussed next are not limited to these systems but may be used in other systems including a magnetometer or other sensor with similar properties.

Reference throughout the specification to "one embodiment" or "an embodiment" means that a particular feature, structure, or characteristic described in connection with an embodiment is included in at least one embodiment of the present invention. Thus, the appearance of the phrases "in one embodiment" or "in an embodiment" in various places throughout the specification is not necessarily all referring to the same embodiment. Further, the particular features, structures, or characteristics may be combined in any suitable manner in one or more embodiments.

As used herein, the term position may refer to linear position, angular position, or a combination of both linear position and angular position. Pose is a common industry term for a combination of linear position and angular position. Linear position may refer to the location that may be defined by any number of methods including a 3D vector of Cartesian coordinates, a 3D vector of spherical coordinates, etc. Angular position may refer to a 3D orientation that may be defined by any number of methods including Euler angles, direction cosine matrix, quaternion, vector/angle, Pauli spin matrix, direction+normal vector, etc. For simplicity of exposition, the description that follows refers to angular position in terms of quaternion. Those skilled in the art will recognize that other definitions of angular position are (e.g. equally) applicable to some or all of the disclosure and various disclosed embodiments described in connection with angular position in terms of quaternion, and can be modified accordingly without undue experimentation. Also, for simplicity of exposition, various disclosed embodiments herein supra and infra are described as utilizing a particular common reference frame, namely, an Earth frame. Those skilled in the art will recognize that a common reference frame other than the Earth frame may be utilized and some or all of the disclosure and various disclosed embodiments can be modified accordingly without undue experimentation. Examples of the common reference frame may include a user frame, a level frame and an arbitrary frame.

Figure 1:
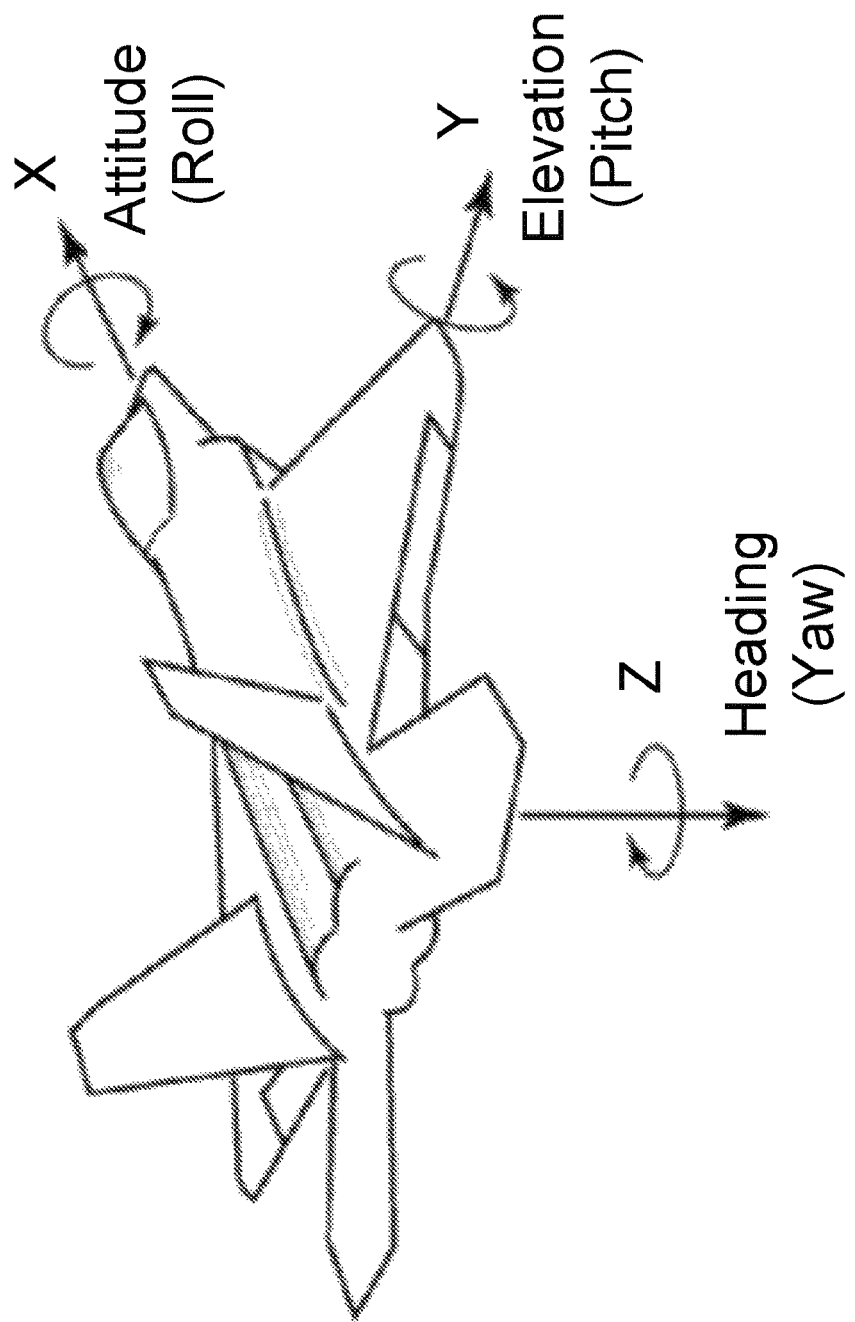
FIG. 1 is an illustration of a 3-D body reference system.
Figure 2:
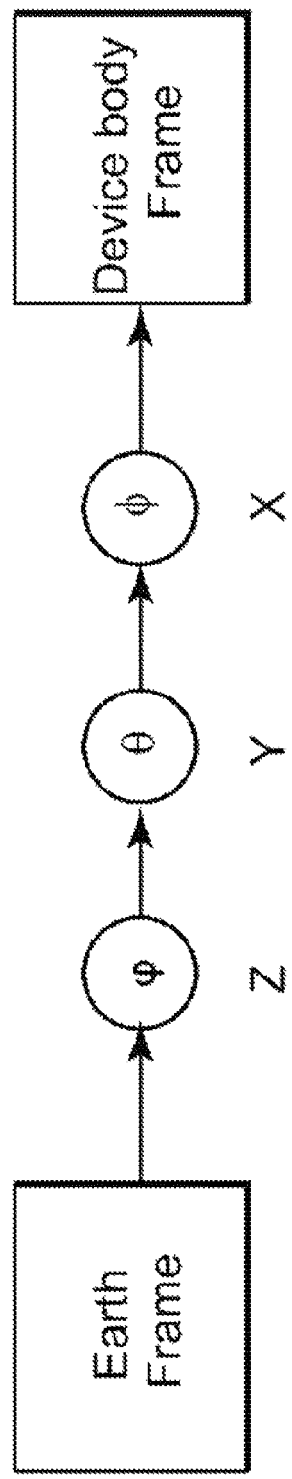
FIG. 2 is an illustration of a transition from a gravitational reference system to a body reference system.
Figure 3:
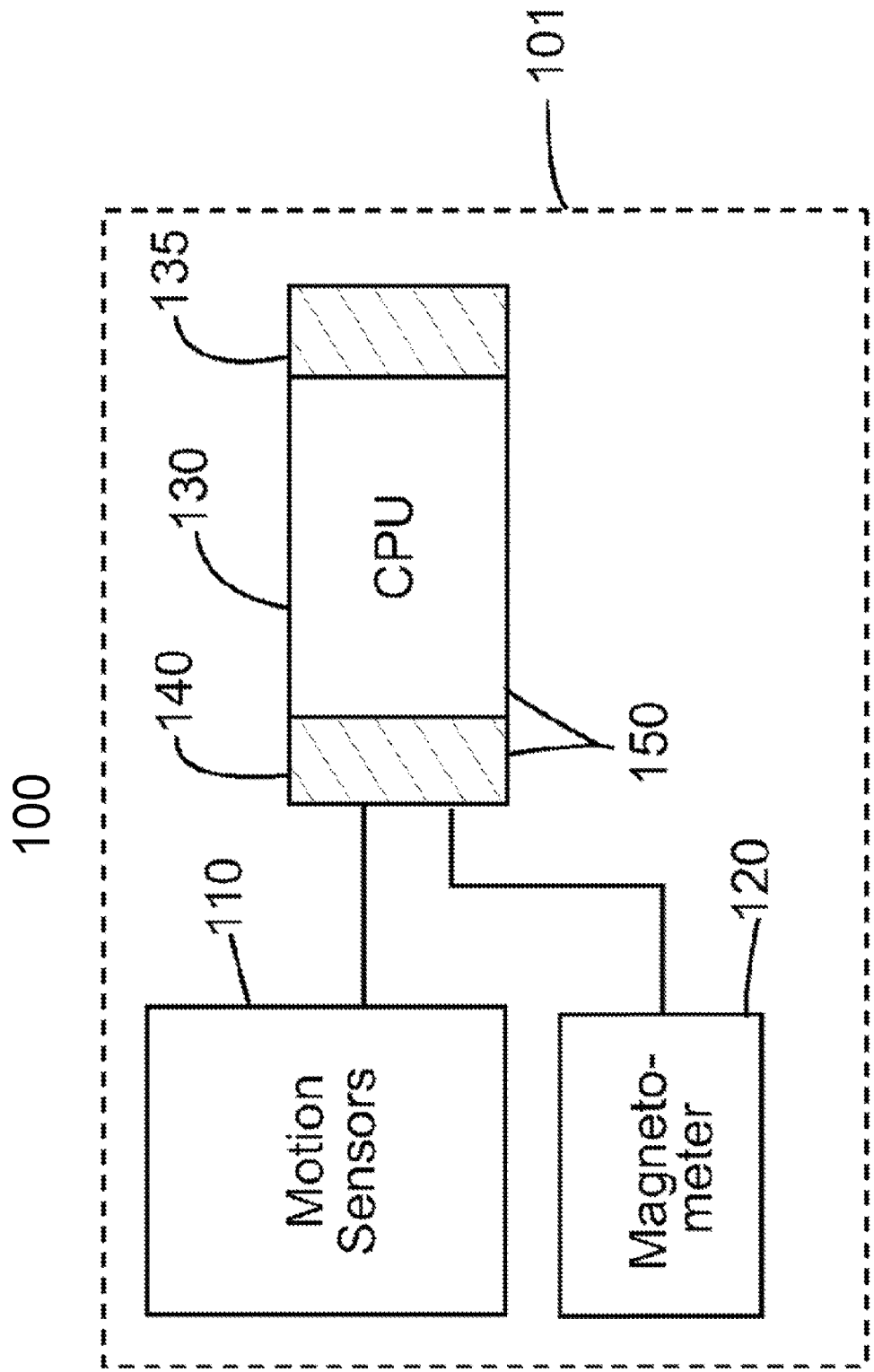
FIG. 3 is a block diagram of a sensing unit, according to an exemplary embodiment.

According to an exemplary embodiment illustrated in FIG. 3, a sensing unit 100, e.g., an IMU, that may be attached to a device in order to monitor the device's orientation includes motion sensors 110 (e.g., one or more gyroscopes and/or one or more accelerometers) and a magnetometer 120 attached to the device's rigid body 101. Concurrent measurements performed by the motion sensors 110 and the magnetometer 120 yield signals sent to a data processing unit 130 via an interface 140.

The interface 140 and the data processing unit 130 constitute a magnetometer calibration unit 150. In FIG. 3, the magnetometer calibration unit 150 is located on the rigid body 101. However, in an alternative embodiment, the magnetometer calibration unit may be remote, receiving data from the magnetometer and the motion sensors or retrieving the data from a data storage medium. The data processing unit 130 includes at least one processor to perform calculations.

The motion sensors 110 and the magnetometer 120 being fixedly attached to the rigid body 101, they generate signals related to observable body reference system (e.g., magnetic field, angular speed, or linear acceleration) in the body reference system. However, as noted above, in order to determine the body's orientation in a reference system independent from the device, one should be able to relate these measured quantities to an observer reference system, e.g., an inertial reference frame, such as the aforementioned gravitational reference system that may be defined to have z-axis along gravity, y-axis in a plane including gravity and the magnetic North direction, and, x-axis pointing East.

The signals reflect quantities measured in the body reference system. These measurements in the body reference system are further processed by the data processing unit 130 to be converted into quantities corresponding to a gravitational reference system. For example, using rotation sensors and a 3-D accelerometer, a roll and pitch of the body reference system to a gravitational orthogonal reference system may be inferred. In order to accurately estimate a yaw angle of the device in the gravitational orthogonal reference system, determining the orientation of the Earth's magnetic field from the magnetic field measured in the body's reference system is necessary.

For determining the orientation of the Earth's magnetic field from the magnetic field measured in the body reference system, the data processing unit 130 corrects the misalignment of the measured 3-D magnetic field (which has been calculated from magnetometer signals using attitude independent calibration parameters) using a scale and a misalignment matrix. The misalignment is due to soft-iron effects, mechanic misalignment, and/or manufacture intrinsic misalignment. Once the data processing unit 130 completes all these corrections, the resulting magnetic field may reasonable be assumed to be a local magnetic field corresponding to the Earth's magnetic field. The Earth's magnetic field naturally points North, slightly above or below a plane perpendicular to gravity, by a known angle called "dip angle" or "inclination angle".

The data processing 130 may be connected to a computer readable medium 135 storing executable codes which, when executed, make the system 100 perform methods for determining the position and/or motion of the device to which the magnetometer and sensors are attached, including, for instance, any one or more of orientation, location, rotation, speed, acceleration, and heading.

2. Planar Magnetometer Calibration

In this section are described three techniques, discussed in order of decreasing complexity, for calibrating a magnetometer in two dimensions (2D). Also described in this section are techniques for fusing the 2D calibrated magnetometer data with an overall sensor fusion technique to correct the heading determination.

One general model for magnetometer calibration is given in U.S. Patent Application Publication No. 2013/0238268 to Sheng (Apparatuses and Methods for Calibrating Magnetometer Attitude-Independent Parameters) as $$(I+D)h_n = A_n h_0 + b + \varepsilon_n, \quad n=1,2,\ldots,N \tag{2.1}$$

Here $h_n$, $A_n$, and $\varepsilon_n$ are measured body frame magnetic field, rotation matrix, and noise at time n. $h_0$ is the true user frame magnetic field before rotation. $\|h_0\|^2$ could be assumed to be any constant, since the amplitude of the magnetic field does not affect the heading. Without loss of generality, one may assume $\|h_0\|^2=1$ in the equations below. $A_n h_0$ is the true body frame mag if $A_n$ is accurate/known.

$$h_n = [h_{nx}\ h_{ny}\ h_{nz}]'.$$

b is the offset, $$b = [b_x\ b_y\ b_z]'.$$

(I+D) is the gain and skew matrix. We assume it is symmetric.

$$(I+D) = \begin{bmatrix} p_x & p_{xy} & p_{xz} \\ p_{xy} & p_y & p_{yz} \\ p_{xz} & p_{yz} & p_z \end{bmatrix}.$$

After calibration, we get $$\hat{h}_n = (I+D)h_n - b \quad (2.2)$$

Computing the norm gives $\|\hat{h}_n\|^2 = \|(I+D)h_n - b\|^2 = 1 + \|\varepsilon_n\|^2 + 2\varepsilon_n' A_n h_0,$ (2.2)

This shows that the calibrated magnetic field vectors locate close to a sphere with radius 1.

If we ignore noise, then $$h_n'(I+D)'(I+D)h_n 2b'(I+D)h_n + \|b\|^2 = 1 \quad (2.3)$$

Using a least square fitting framework, the goal is to find 9 variables (in matrix (I+D) and vector b,) to minimize $$(\|(I+D)h_n - b\|^2 - 1)^2.$$

When the motion is mostly planar (rotation around gravity), there is not enough information to fit to a sphere. However, the horizontal component of magnetic field can be fitted to an ellipse or a circle, and still provide heading information.

In this case, if we only take the first two rows of Eq. (2.1), and ignore the coupling from the z channel, e.g., $p_{xz}$, then there are only 5 parameters to find in scale and skew matrix (I+D) and offset vector b, namely, 2 scales ($p_x$, $p_y$), one skew ($p_{xy}$), and two offsets ($b_x$, $b_y$):

$$(I+D) = \begin{bmatrix} p_x & p_{xy} \\ p_{xy} & p_y \end{bmatrix},$$

$$b = [b_x \, b_y]'.$$

The goal is to fit this into a skewed ellipse.

2.1 General 2D Fitting: Skewed Ellipse

Expanding Eq (2.3) with the fitting parameters, we get:

$$(p_x^2 + p_{xy}^2)h_{nx}^2 + (p_y^2 + p_{xy}^2)h_{ny}^2 + 2p_{xy}(p_x + p_y)h_{nx}h_{ny} - \quad (2.4)$$
$$2(b_x p_x + b_y p_{xy})h_{nx} - 2(b_y p_y + b_x p_{xy})h_{ny} + \|b\|^2 - 1 = 0.$$

For convenience, construct new variables ($q_1$, $q_2$, $q_3$, $q_4$, $q_5$) as follows:

$$(I+D)'(I+D) = \begin{bmatrix} p_x^2 + p_{xy}^2 & p_{xy}(p_x + p_y) \\ p_{xy}(p_x + p_y) & p_y^2 + p_{xy}^2 \end{bmatrix} = \begin{bmatrix} q_1 & q_3 \\ q_3 & q_2 \end{bmatrix}, \quad (2.5)$$

$$(I+D) \cdot b = \begin{bmatrix} b_x p_x + b_y p_{xy} \\ b_y p_y + b_x p_{xy} \end{bmatrix} = \begin{bmatrix} q_4 \\ q_5 \end{bmatrix}.$$

Then we get $q_1 h_{nx}^2 + q_2 h_{ny}^2 +$
$$2q_3 h_{nx} h_{ny} - 2q_4 h_{nx} - 2q_5 h_{ny} + \|b\|^2 - 1 = 0.$$

$$\frac{q_1}{q_2} h_{nx}^2 + 2\frac{q_3}{q_2} h_{nx} h_{ny} - 2\frac{q_4}{q_2} h_{nx} - 2\frac{q_5}{q_2} h_{ny} + \frac{\|b\|^2 - 1}{q_2} = -h_{ny}^2.$$

Define $t_n = [h_{nx}^2 \, 2h_{nx}h_{ny} \, -2h_{nx} \, -2h_{ny} \, 1]$, $T = \begin{bmatrix} t_1 \\ \vdots \\ t_N \end{bmatrix}$, $$k = \begin{bmatrix} \frac{q_1}{q_2} & \frac{q_3}{q_2} & \frac{q_4}{q_2} & \frac{q_5}{q_2} & \frac{\|b\|^2 - 1}{q_2} \end{bmatrix}',$$

$$u_n = -h_{ny}^2, \quad u = \begin{bmatrix} u_1 \\ \vdots \\ u_N \end{bmatrix}.$$

Then, $T * k = u$.

This is a Least Square Fitting problem with fitting parameters in vector k. The solution that minimizes square fitting error $|T*k - u|^2$ is given by:

$$\hat{k} = (T'T)^{-1}(T'u) \quad (2.6)$$

After obtaining the best fit $\hat{k} = [k_1 \, k_2 \, k_3 \, k_4 \, k_5]$, let $\Lambda = \begin{bmatrix} k_1 & k_2 \\ k_2 & 1 \end{bmatrix}$, then we have $$(I+D)'(I+D) = \begin{bmatrix} q_1 & q_3 \\ q_3 & q_2 \end{bmatrix} = q_2 \cdot \Lambda,$$

$$(I+D) \cdot b = q_2 \begin{bmatrix} k_3 \\ k_4 \end{bmatrix}.$$

Therefore, we have $$(I+D) = \sqrt{q_2} \cdot \Lambda^{\frac{1}{2}}, \text{ and}$$

$$b = (I+D)^{-1} \cdot q_2 \cdot \begin{bmatrix} k_3 \\ k_4 \end{bmatrix} = \sqrt{q_2} \cdot \Lambda^{-\frac{1}{2}} \begin{bmatrix} k_3 \\ k_4 \end{bmatrix}.$$

hence $\|b\|^2 = b'b = q_2 \cdot [k_3 \, k_4] \cdot \Lambda^{-1} \cdot \begin{bmatrix} k_3 \\ k_4 \end{bmatrix}.$ Since $\|b\|^2$ is also related to $k_5$, $$k_5 = \frac{\|b\|^2 - 1}{q_2},$$

therefore $q_2$ can be obtained by $$q_2 = \left([k_3 \, k_4] \cdot \Lambda^{-1} \cdot \begin{bmatrix} k_3 \\ k_4 \end{bmatrix} - k_5 \right)^{-1}.$$

Then the calibration parameters are given by $$(I+D) = \sqrt{q_2} \cdot \Lambda^{\frac{1}{2}}$$

$$b = \sqrt{q_2} \cdot \Lambda^{-\frac{1}{2}} \begin{bmatrix} k_3 \\ k_4 \end{bmatrix}.$$

This is the general ellipse fitting with scale, skew, and offset.

2.2 Simple Fitting: Upright Ellipse

For a simpler model, assume there is no skew, then the fitting is to an upright ellipse.

If we assume that there is no skew, Eq. (2.4) can be simplified to:

$$p_x^2 h_{nx}^2 + p_y^2 h_{ny}^2 - 2b_x p_x h_{nx} - 2b_y p_y h_{ny} + \|b\|^2 - 1 = 0$$

Rewrite it as:

$$\left(\frac{p_x}{p_y}\right)^2 h_{nx}^2 - 2\frac{b_x p_x}{p_y^2} h_{nx} - 2\frac{b_y}{p_y} h_{ny} + \frac{\|b\|^2 - 1}{p_y^2} = -h_{ny}^2 \quad (2.7)$$

In matrix format, define $$t_n = [h_{nx}^2 \; -2h_{nx} \; -2h_{ny} \; 1], \; T = \begin{bmatrix} t_1 \\ \vdots \\ t_N \end{bmatrix},$$

$$k = \left[\left(\frac{p_x}{p_y}\right)^2 \; \frac{b_x p_x}{p_y^2} \; \frac{b_y}{p_y} \; \frac{\|b\|^2 - 1}{p_y^2}\right]', \text{ and}$$

$$u_n = -h_{ny}^2, \; u = \begin{bmatrix} u_1 \\ \vdots \\ u_N \end{bmatrix}.$$

Then the calibration parameters can be obtained as ($\hat{k} = [k_1 \; k_2 \; k_3 \; k_4]$);

$$p_y = \left(k_3^2 + \frac{k_2^2}{k_1} - k_4\right)^{-1/2},$$

$$p_x = \sqrt{k_1} \cdot p_y,$$

$$b = [k_2/\sqrt{k_1} \; k_3]' \cdot p_y$$

2.3 Simplest Model: Circle Fitting

The fitting model can be even further simplified to a circle fitting: If we further simplify by assuming $p_x = p_y = p$, we get the following equation from Eq. (2.7):

$$p^2(h_{nx}^2 + h_{ny}^2) - 2b_x p h_{nx} - 2b_y p h_{ny} + \|b\|^2 - 1 = 0 \quad (2.8)$$

Rewrite it as:

$$2\frac{b_x}{p} h_{nx} + 2\frac{b_y}{p} h_{ny} - \frac{1 - \|b\|^2}{p^2} = h_{nx}^2 + h_{ny}^2$$

In matrix format $$t_n = [2h_{nx} \; 2h_{ny} \; 1],$$

$$k = \left[\frac{b_x \; b_y \; 1 - \|b\|^2}{p \; p \; p^2}\right]',$$

$$u_n = h_{nx}^2 + h_{ny}^2.$$

The solution is obtained from least square fit $\hat{k} = [k_1 \; k_2 \; k_3]$ as:

$$p = (k_1^2 + l_2^2 + k_3)^{-1/2},$$

$$b = [k_1 \; k_2]' \cdot p.$$

2.4 Iterative Accumulator and Residual Fitting Error

As previously noted, the optimal solution to the Least Square Fitting problem (with fitting parameter k) is given by Eq. (2.6) above.

Notice that $$T'T = [t_1' \ldots t_N'] \cdot \begin{bmatrix} t_1 \\ \vdots \\ t_N \end{bmatrix} = \sum_{n=1}^N t_n' \cdot t_n,$$

$$T'u = [t_1' \ldots t_N'] \cdot \begin{bmatrix} u_1 \\ \vdots \\ u_N \end{bmatrix} = \sum_{n=1}^N t_n' \cdot u_n.$$

This means that both T'T and T'u can be obtained by iterative accumulation of $(t_n' \cdot t_n)$ and $(t_n' \cdot u_n)$ for each sample n. There is no need to keep the samples themselves. The minimal fitting error of the fitting problem T*k=u is given by $$\min_k |T * k - u|^2 \quad (2.9)$$

$$= |T * \hat{k} - u|^2$$

$$= (T * \hat{k} - u)' \cdot (T * \hat{k} - u)$$

$$= \hat{k}'T'T\hat{k} - 2\hat{k}'T'u + u'u$$

$$= u'u - \hat{k}'T'u$$

$$|T * \hat{k} - u|^2 = u'u - \hat{k}'T'u$$

Notice that, depending on how we construct $t_n$, k, and $u_n$, the solution $\hat{k}$ obtained by Eq. (2.6) may not give directly the minimal mean square fitting error between $\|\hat{h}_n\|$ and $\|h_0\|$ (which is 1 by assumption), $$(\|(I+D)h_n - b\| - 1)^2,$$

as we wanted. But this mean square fitting error (MSE) is related to $\|T*\hat{k} - u\|^2$.

Using the ellipse fitting of (Eq. 2.7) as an example, $$t_n \cdot \hat{k} - u_n = \frac{1}{p_y^2} \cdot (\|\hat{h}_n\|^2 - 1).$$

Because after calibration $\|\hat{h}_n\| \approx 1$, $$\|\hat{h}_n\|^2 - 1 \approx 2 \cdot (\|\hat{h}_n\| - 1). \quad (2.10)$$

Therefore, $|T * \hat{k} - u|^2$ $$= \sum_{n=1}^N (t_n \cdot \hat{k} - u_n)^2$$

$$= \frac{4}{p_y^4} \cdot \Sigma_{n=1}^N (\|\hat{h}_n\| - 1)^2$$

The mean square fitting error of $\|\hat{h}_n\|$ is given by $$\frac{1}{N}\sum_{n=1}^N (\|\hat{h}_n\| - 1)^2 = \frac{p_y^4}{4N}(u'u - \hat{k}'T'u) \quad (2.11)$$

For the planar magnetic calibration to converge, the sensor must capture enough data to cover a large part of the ellipse, i.e., data from a large heading range. The fitting error will decrease as the angular range over which data is collected increases. For the robot vacuum cleaner (RVC)

case, spinning half a turn (i.e., 180°) usually is sufficient for convergence to occur. This is easy to achieve as the RVC will spin naturally as it changes direction.

Figure 4B:
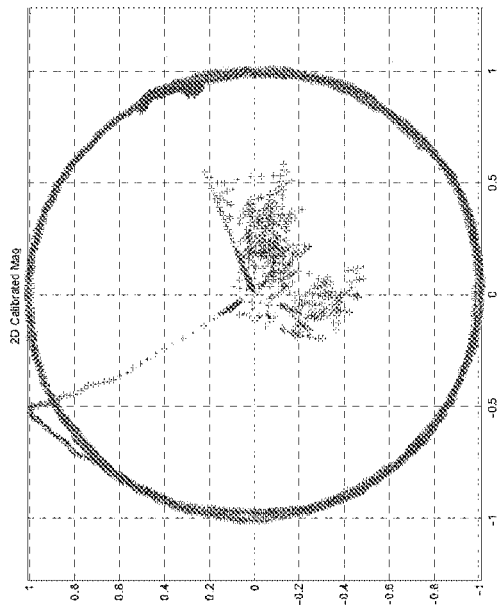
FIG. 4B is a graphical representation of the magnetic field of FIG. 4A but calibrated using a circle fitting.
Figure 4A:
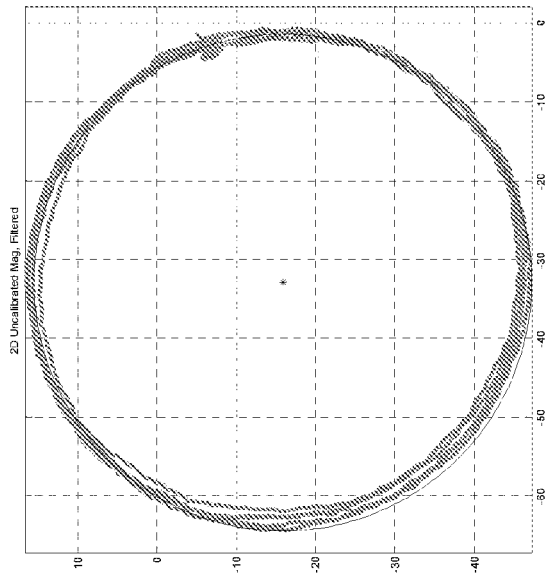
FIG. 4A is a graphical representation of an example uncalibrated planar magnetic field.
Figure 4D:
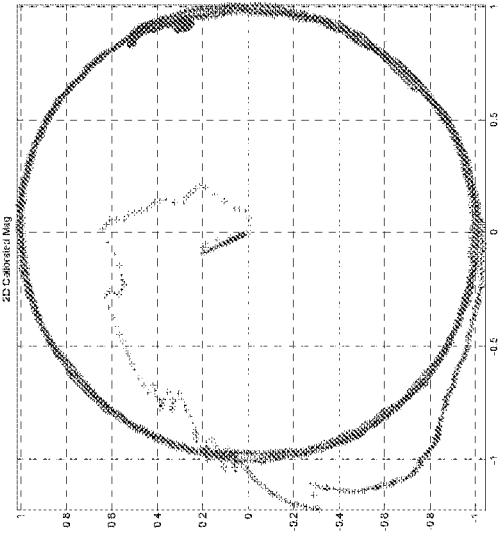
FIG. 4D is a graphical representation of the magnetic field of FIG. 4A but calibrated using a skewed elliptical fitting.
Figure 4C:
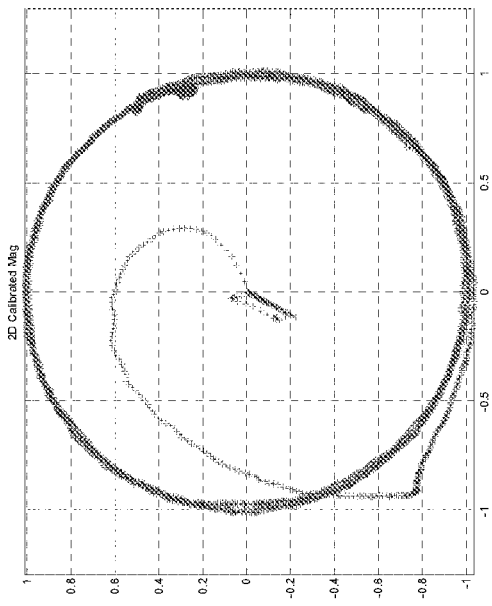
FIG. 4C is a graphical representation of the magnetic field of FIG. 4A but calibrated using an elliptical fitting.
Figure 5A:
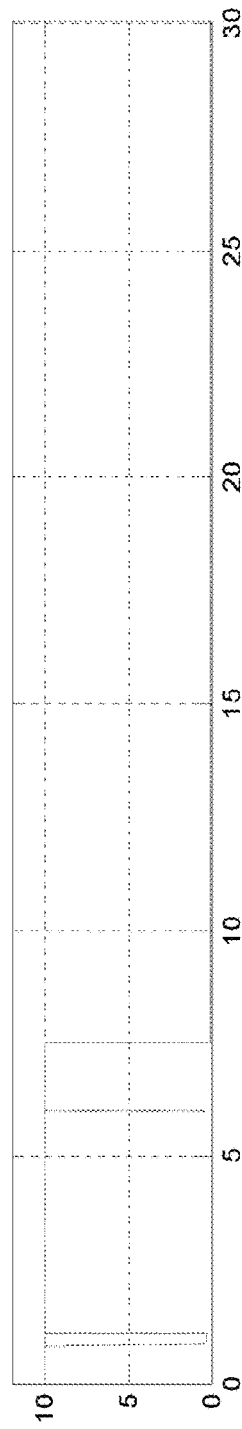
FIGS. 5A through 5D are graphical illustrations showing the convergence of the Mean Square Error, offset, scale, and overall error of the planar magnetic field calibration as a function of time.
Figure 5B:
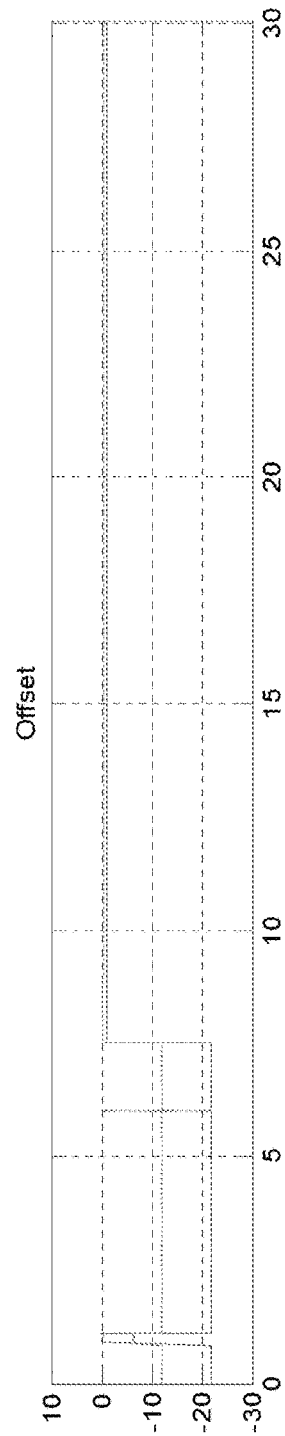
Figure 5C:
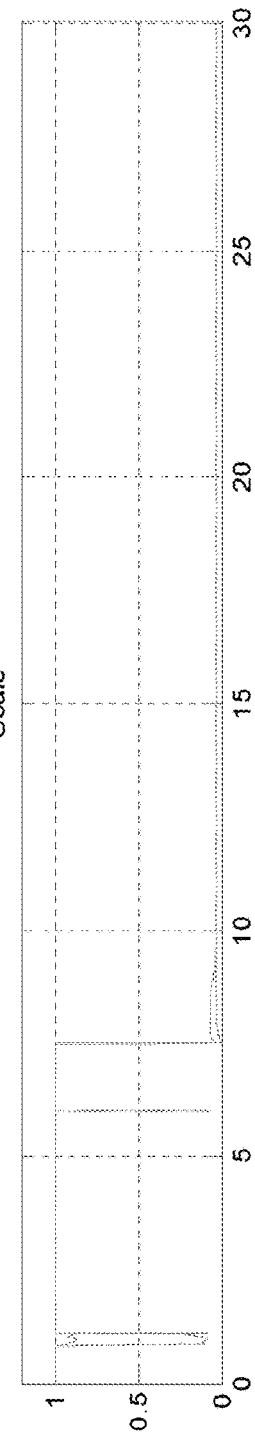
Figure 5D:
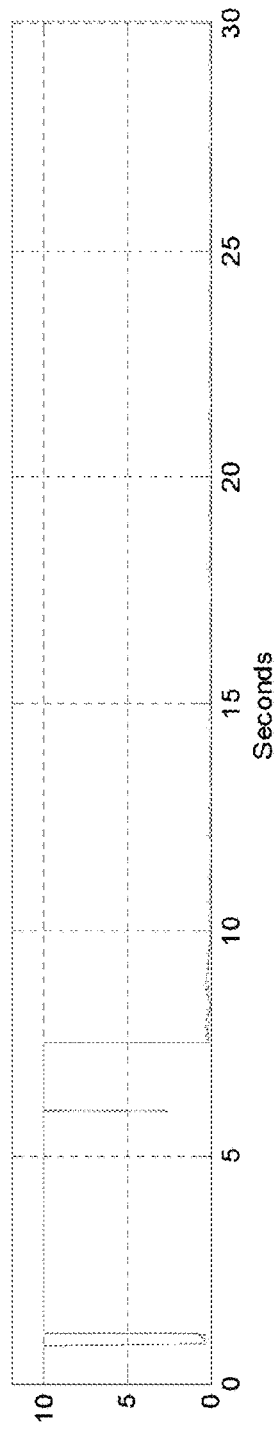

All three different planar models were used on example captured data. FIG. 4A is a graphical representation of the example uncalibrated planar magnetic field captured data. FIGS. 4B, 4C, and 4D are graphical representations of the data after calibration in accordance with the principles of the present invention using a skewed elliptical fit, an upright elliptical fit, and a circular fit, respectively. All three embodiments converged quickly, found the correct parameters, and gave the correct heading.

FIGS. 5A through 5D show the convergence process of the Mean Square Error, offset, scale, and overall error of the planar magnetic field calibration as a function of time, using an upright elliptical fitting (e.g., corresponding to FIG. 4C).

2.5 2D Calibration with Gyroscope or Gyroscope and Accelerometer

In the calibration model Eq. (2.1), the assumption is that both the rotation matrix $A_n$ and the true user frame magnetic field $h_0$ are unknown. Therefore, the true body frame magnetic field given by $A_n h_0$ is unknown, except that we can assume the amplitude is 1 ($\|A_n \cdot h_0\|^2 = 1$). All the equations for fitting above are based on the assumption that the calibrated magnetic field $\hat{h}_2 = (I+D) h_n - b$ should have amplitude around 1.

However, in a system with one or more gyroscopes (or gyroscopes and accelerometers), partial information about the rotation matrix $A_n$ is available. Although the initial orientation is unknown, the device orientation change q from the initial point can be obtained from gyroscope data integration (or from the 6-axis sensor fusion of gyroscope and accelerometer). Let us call the rotation matrix from the user frame to the initial orientation $R_0$, and the rotation matrix from the initial orientation to the current orientation $R(q)$. Then, the true body frame magnetic field is $R(q) \cdot R_0 \cdot h_0$. The initial orientation is, in general, unknown, but the orientation change $R(q)$ is usually accurate within a short period (about minutes), as long as the gyroscope is reasonably calibrated.

In the 2D case, this means that, although initial heading of the horizontal projection of the magnetic field is unknown, the gyroscope integration has the information about how much of a circle the calibrated magnetometer should cover. This extra information, added to the fact that the calibration should fit the magnetic field to a circle, e.g., see FIG. 4A, may be used to greatly reduce the fitting error and speed up the calibration.

2.5.1 Calibration Model/Block diagram

When working with the horizontal projection of magnetic field, it may be assumed that the earth magnetic field always points to north:

$$h_0 = [1\ 0]'.$$

Also, both R(q) and $R_0$ are 2×2 rotation matrices in a 2D plane, and the matrix multiplication is commutative (note that this is not true for the general 3D case). Therefore, the horizontal components of the true body frame magnetic field is:

$$h^{Truth} = R_0 \cdot R(q_n) \cdot h_0 = R_0 \cdot h^{q_n}, \quad (2.11)$$

where $h^{q_n} = R(q_n) \cdot h_0$ is the magnetic vector predicted by the gyroscope.

The calibration model becomes $$(I+D) h_n = R_0 h^{q_n} + b + \varepsilon_n, \quad n=1,2,\ldots,N \quad (2.12)$$

Rewrite this equation in the following format:

$$R_0' \cdot (I+D) h_n - R_0' \cdot b = h^{q_n},$$

Define Augmented Measurement $$\tilde{h}_n = [h_{nx}, h_{ny}, -1],$$

and parameter matrix $$M = \begin{bmatrix} (I+D) \cdot R_0 \\ b' \cdot R_0 \end{bmatrix},$$

Then, the problem is to find matrix M such that:

$$\tilde{h}_n M = h^{q_n\prime} \quad (2.13)$$

After accumulating N samples $\tilde{h}_n$ and $h^{q_n}$ where $n=1, 2, \ldots, N$, then Eq. (2.13) becomes:

$$H \cdot M = Q, \text{ with } H = \begin{bmatrix} \tilde{h}_1 \\ \vdots \\ \tilde{h}_N \end{bmatrix}, Q = \begin{bmatrix} h^{q_1\prime} \\ \vdots \\ h^{q_N\prime} \end{bmatrix}. \quad (2.14)$$

Eq. (2.14) can be solved for M using the matrix pseudo inverse:

$$\hat{M} = H \backslash Q.$$

The calibration $\hat{M}$ could be applied to an incoming sample $\tilde{h}_n$ by multiplying $\tilde{h}_n \cdot \hat{M}$, but would have the effect of removing any information about where magnetic North is pointing. Therefore, we need to remove just the rotation component of the calibration.

Based on $\hat{M}$, the initial orientation $R_0$ can be obtained by decomposing the top 2 rows of matrix $\hat{M}$, called $M_{2\times2}$, into an orthogonal rotation matrix $R_0$ and a scale and skew matrix (I+D) by using matrix polar decomposition. See, https://en.wikipedia.org/wiki/Polar_decomposition#Matrix_polar_decomposition.

First, perform the singular value decomposition:

$$M_{2\times2} = W \Sigma V^*,$$

Then $$(I+D) = W \Sigma W^*,$$

$$R_0 = W V^*,$$

$$b = R_0 * M_3',$$

with $M_3$ being the third row of matrix M.

The initial rotation can be removed by multiplying by the transpose of $R_0$. Thus, the calibrated 2D magnetic field is given by:

$$\hat{h}_n' = \tilde{h}_n \cdot \hat{M} \cdot R_0' \quad (2.15)$$

Following the definition of matrices, this also gives:

$$\hat{h}_n' = h_n \cdot (I+D) - b',$$

which is the same as set forth in previous sections.

2.5.2 Recursive Least Squares Implementation

A more efficient way of solving Eq. (2.14) without buffering all the samples is the Recursive Least Square algorithm.

In accordance with such an embodiment, one may expand Eq. (2.14) as the following:

$$[h_{nx} \quad h_{ny} \quad -1] \cdot \begin{bmatrix} M_{11} & M_{12} \\ M_{21} & M_{22} \\ M_{31} & M_{32} \end{bmatrix} = [h_x^{q_1} \quad h_y^{q_1}] \quad (2.16)$$

Notice that we can separate this equation into the following two equations, each with only 3 parameters, and solve each independently.

$$[h_{nx} \quad h_{ny} \quad -1] \cdot \begin{bmatrix} M_{11} \\ M_{21} \\ M_{31} \end{bmatrix} = h_x^{q_n} \quad (2.16a)$$

$$[h_{nx} \quad h_{ny} \quad -1] \cdot \begin{bmatrix} M_{12} \\ M_{22} \\ M_{32} \end{bmatrix} = h_y^{q_n} \quad (2.16b)$$

The Eq. (2.16) may be rewritten as, $$\tilde{h}_n \times M^x = h_x^{q_n}, \quad (2.17a)$$

$$\tilde{h}_n \times M^y = h_y^{q_n}, \quad (2.17b)$$

by redefining parameter vector M=[M$^x$ M$^y$] as $$M^x = \begin{bmatrix} M_{11} \\ M_{2l} \\ M_{31} \end{bmatrix}, M^y = \begin{bmatrix} M_{12} \\ M_{22} \\ M_{32} \end{bmatrix}.$$

We then build matrix H (N×3) from concatenating $\tilde{h}_n$ for at samples n=1, 2, . . . , N, and vector Q$^x$, Q$^y$ (2N×1) from concatenating $h_x^{q_n}$ and $h_y^{q_n}$ $$H = \begin{bmatrix} \tilde{h}_1 \\ \vdots \\ \tilde{h}_N \end{bmatrix}, Q^X = \begin{bmatrix} h_x^{q_1} \\ \vdots \\ h_x^{q_N} \end{bmatrix}, Q^y = \begin{bmatrix} h_y^{q_1} \\ \vdots \\ h_y^{q_N} \end{bmatrix}.$$

and the least square fitting problem is now:

$$H \cdot M^x = Q^x, \quad (2.18a)$$

$$H \cdot M^y = Q^y. \quad (2.18b)$$

Equations (2.18a) and (2.18b) can be solved using the least square optimization method $$\hat{M}^x = (H'H)^{-1} \times (H'Q^x), \quad (2.19a)$$

$$\hat{M}^y = (H'H)^{-1} \times (H'Q^y). \quad (2.19b)$$

The least square solution in Eq. (2.19) can be solved using an iterative method without the need of save the big matrices H, Q$^x$, and Q$^y$, as only H'H, H'Q$^x$, and H'Q$^y$ need to be saved.

$$H'H = \sum_{n=1}^{N} \tilde{h}_n' \cdot \tilde{h}_n, \quad (2.20)$$

$$H'Q^x = \sum_{n=1}^{N} \tilde{h}_n' \cdot h_x^{q_n}, \quad (2.21)$$

$$H'Q^y = \sum_{n=1}^{N} \tilde{h}_n' \cdot h_y^{q_n}. \quad (2.22)$$

A forget factor can be applied to the accumulated H'H, H'Q$^x$, and H'Q$^y$. The appropriate factor can be used to ensure that any errors associated with gyroscope drift will be forgotten before they have a chance to cause significant errors to the magnetometer calibration.

In U.S. Provisional Patent Application No. 62/639,746, filed Mar. 7, 2018 which is incorporated herein fully by reference, gyroscope integration is used to help with the magnetometer calibration. However, there, the assumption is that the absolute orientation is known, i.e., rotation matrix A$_n$ is known. In the present embodiment of 2D calibration, the only assumption is that the orientation change is obtained from the gyroscope, and the initial orientation is irrelevant to the ability to calibrate the magnetometer.

3. Heading Fusion with 2D Calibrated Mag

From the 2D calibrated magnetic field $\hat{h}=[h_x \ h_y]$, we can calculate the heading as:

Heading_Mag=atan2($h_y$, $h_x$)

where atan2 is the four quadrant arctangent of y/x.

The basic assumption for the planar calibration is that the motion of the device is substantially planar, which is why the x and y components of the magnetic field can be described as an ellipse and the z component of the magnetic field can be assumed to remain approximately constant.

If, however, the device tilts from the x-y plane by more than a nominal amount, these assumptions may no longer hold, and the heading determination using the planar magnetometer calibration may no longer be reliable. The issue of tilt may be addressed in several ways.

The tilt of the device z axis from the vertical direction is available from the accelerometer and may be used as a metric of how planar the motion is. Occasional large tilt also can be easily detected using the variation of the z axis data of the magnetometer.

If the measured tilt is negligible (e.g., below a threshold), then the aforementioned assumptions likely hold, and the heading determination from the planar magnetometer-based calibration may be used. However, when the tilt is not negligible, the framework of planar calibration may no longer hold, and the heading obtained by using the planar calibration may have large error. In such instances, the heading determination from the planar magnetometer calibration should not be trusted, and heading determination may be based on other data. For example, another source of heading is from a 6-axis sensor fusion of the accelerometer and gyroscope data, hereinafter termed 6AG heading or Heading_6AG. Various techniques are known for fusing the measurements from a 6 axis IMU (3 orthogonal gyroscopes and three orthogonal accelerometers) to determine the heading change since the starting point. Finally, in the extreme case of significant tilt over a large amount of time, the planar magnetometer-based heading calibration should not be used. In such cases, a conventional 3D calibration may be used to estimate heading instead. If and when planar stability is re-attained, the planar magnetometer-based heading calibration may be used again.

The magnetometer-based heading data is trustworthy only when the calibration quality is good. Thus, it may be advisable to track data indicative of the quality of the calibrated magnetometer output and use that quality data to prevent the use of the magnetometer-based heading data (or at least give it a lesser weight in heading fusion with other sensor data) when its quality is relatively low.

There are several possible metrics for determining the reliability of the magnetometer-based heading determination. One such metric is mean square error of the residual after applying the calibration. Therefore, in one embodiment, the mean square error of the residual after applying the calibration may be tracked in order to determine when (and/or to what extent) the heading from the magnetic field data is trustworthy. Another such metric is the magnitude of the calibrated field at any given instant relative to the ellipsoid.

Also, as previously mentioned, device tilt may be used as a metric of the reliability of the magnetometer-based heading determination.

In some embodiments, if the reliability of the magnetometer-based heading is below a given threshold (as determined by any means), then it may be discarded. In other embodiments, the magnetometer-based heading may still be used, but assigned a weight relative to heading data obtained from other sources as a function of its determined reliability in an appropriate heading fusion algorithm.

The 6-axis sensor fusion heading, Heading_6AG, provides the heading change since an arbitrary starting point. Gyroscope integration is accurate in the short term, but may drift slowly over the long term. Heading would be more accurate if gyroscope-integration-based heading were combined with magnetometer-based heading.

In one embodiment, a weight, y, having a value between zero and one may be used to weight the 6AG heading when combining the two headings, $$\text{Heading} = (1-y) * \text{Heading\_Mag} + y * \text{Heading\_6AG}. \quad (3.2)$$

Typically, y may be set close to 1, since the gyroscope integration error is small compared to the noise and variation in the instantaneous magnetometer value. In one embodiment, y may be set to a fixed value (less than one) whenever the magnetometer-based heading is deemed trustworthy and y may be set to one when the magnetometer-based heading is deemed not trustworthy. Alternately, y may be assigned dynamically, e.g., weight as a function of magnetometer calibration quality, to minimize the effect of magnetic interference on the heading. Calibration quality can be related to how consistent the current measurement is to the calibration amplitude. It also can be related to the calibration residual.

If the magnetic interference is severe, or if there is not enough motion, the planar calibration may not be able to find a solution. In this case, the magnetic field is not used, and heading may be obtained from 6AG quaternion alone, until a good quality magnetic calibration is found.

Figure 6:
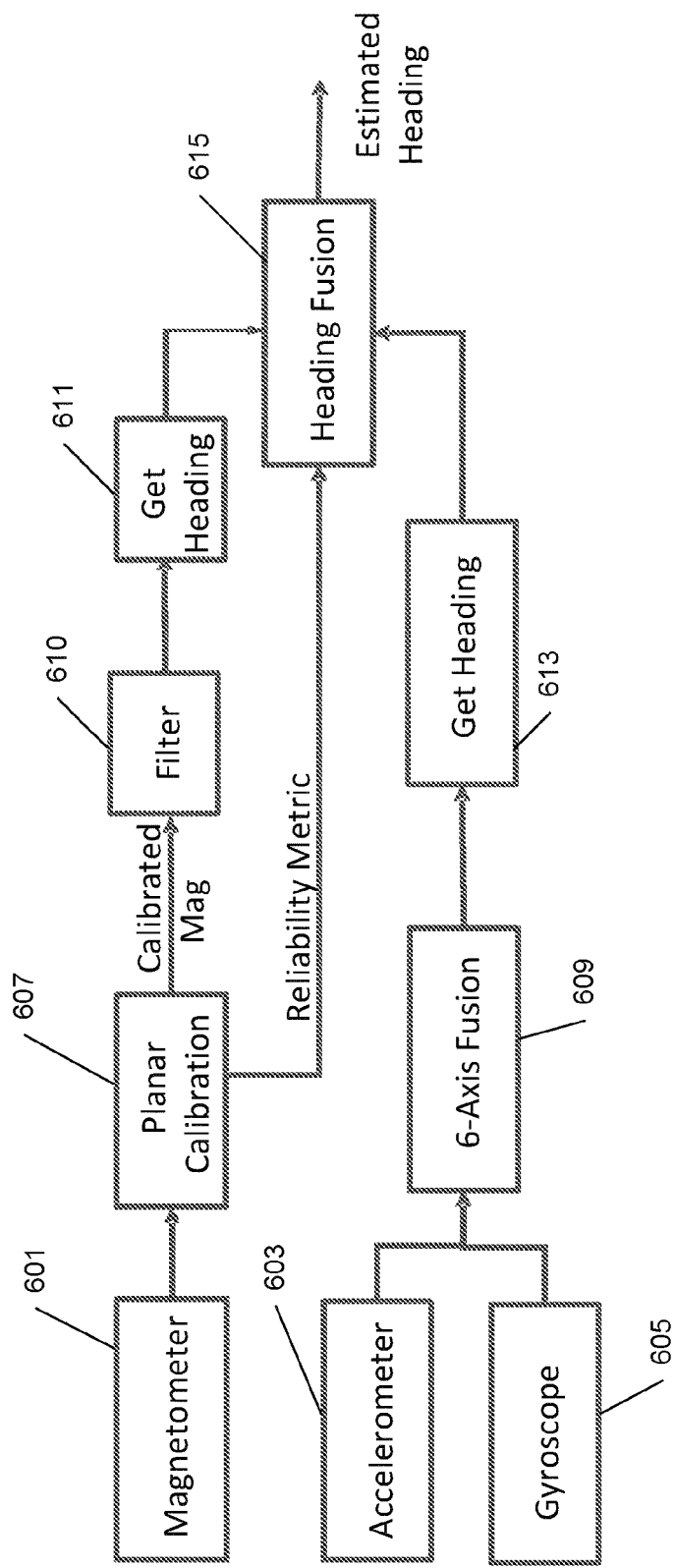
FIG. 6 is a block diagram of one example method for heading fusion using the calibrated magnetometer and a 6AG heading result.

FIG. 6 is a block diagram of one example method for heading fusion using the calibrated magnetometer and a 6AG heading result. First, the uncalibrated magnetic field measurement from the magnetometer 601 is input to a planar calibration block 607 that calibrates the magnetic field measurement in accordance with the principles set forth above in general and/or in accordance with any of the aforedescribed particular embodiments (e.g., circular fit, upright elliptical fit, skewed elliptical fit). The calibrated magnetic field measurement from the calibration block is fed to a filtering block 610 to filter out noise components and to separate the undesirable time-dependent components within the signal (e.g., jitter and magnetic interference effects) from the time stable components within the signal (e.g., the Earth's magnetic field). U.S. Pat. No. 9,482,554 to Cook et al. discloses a gyroscope stabilized filter that may be implemented in filter block 610. However, other filtering techniques also are known and may be used. Next, the calibrated and filtered magnetometer measurements are fed to heading block 611, which generates an estimated heading from the calibrated and filtered magnetic field measurements (see, e.g., (Eq. 3.1).

Meanwhile, the measurements from the accelerometer 603 and gyroscope 605 are fed to a 6-axis fusion block 609 that calibrates those measurements to generate calibrated measurements. The 6-axis fusion block 609 fuses the measurement results from the accelerometer and gyroscope (which process also may include filtering, such as of the accelerometer measurements using gyroscope stabilized filter as disclosed in aforementioned U.S. Pat. No. 9,482,554). The calibrated measurements are fed to a second heading block 613, which generates a second heading estimate based on the calibrated accelerometer and gyroscope measurements.

Next, a heading fusion block 615 receives the first heading estimate based on the calibrated magnetometer measurement, the second heading estimate based on the 6-axis fusion of the calibrated accelerometer and gyroscope measurements, and a reliability metric for the magnetometer-based heading estimate (such as y as described above), and generates a final heading estimate based on a weighted combination of the two heading estimates (see, e.g., Eq. (3.2)).

It will be understood that the functions described above in connection with blocks 607 through 615 may be implemented, for example, in the CPU 130 of FIG. 3.

4. Sensor Fusion with 2D Calibrated Mag

In the previous section, the 2D calibrated magnetic field was used to find a first heading estimate without any use of the accelerometer and/or gyroscope data, and the accelerometer and gyroscope data was used in a different function to find a second heading estimate without any use of the magnetometer data. Then, the two results were fused to generate a final heading estimate based partially on both estimates.

However, in another embodiment the 2D calibrated magnetic field may be used in place of the regular 3D calibrated magnetic field in a nine-axis accelerometer, gyroscope, and magnetometer sensor fusion.

If the magnetic field cannot be calibrated (e.g., not enough motion), then the heading estimate in this embodiment would be equivalent to the 6-axis sensor fusion, i.e., 6AG, mentioned in the preceding section based only on gyroscope and accelerometer data. As gyroscope integration will have long term drift, the 6-axis sensor fusion heading will also suffer from long term drift.

When magnetic field and gravity data are available, but gyroscope data is not available, computing the orientation is a formulation of Wahba's problem, and multiple algorithms that solve this problem are known. The result is referred as qFit herein. As qFit follows magnetic field and gravity, it does not drift in the long term. However, it may be affected by temporary magnetic field interference and by other impairments and noise in either the magnetic field readings or gravity readings.

However, when gyroscope, accelerometer, and magnetometer data are all available, then this 2D calibrated magnetometer value with the vertical axis set as 0 can be used as part of a 9-axis sensor fusion to compute the orientation of the device. Any 9-axis sensor fusion algorithm could be used.

Figure 7:
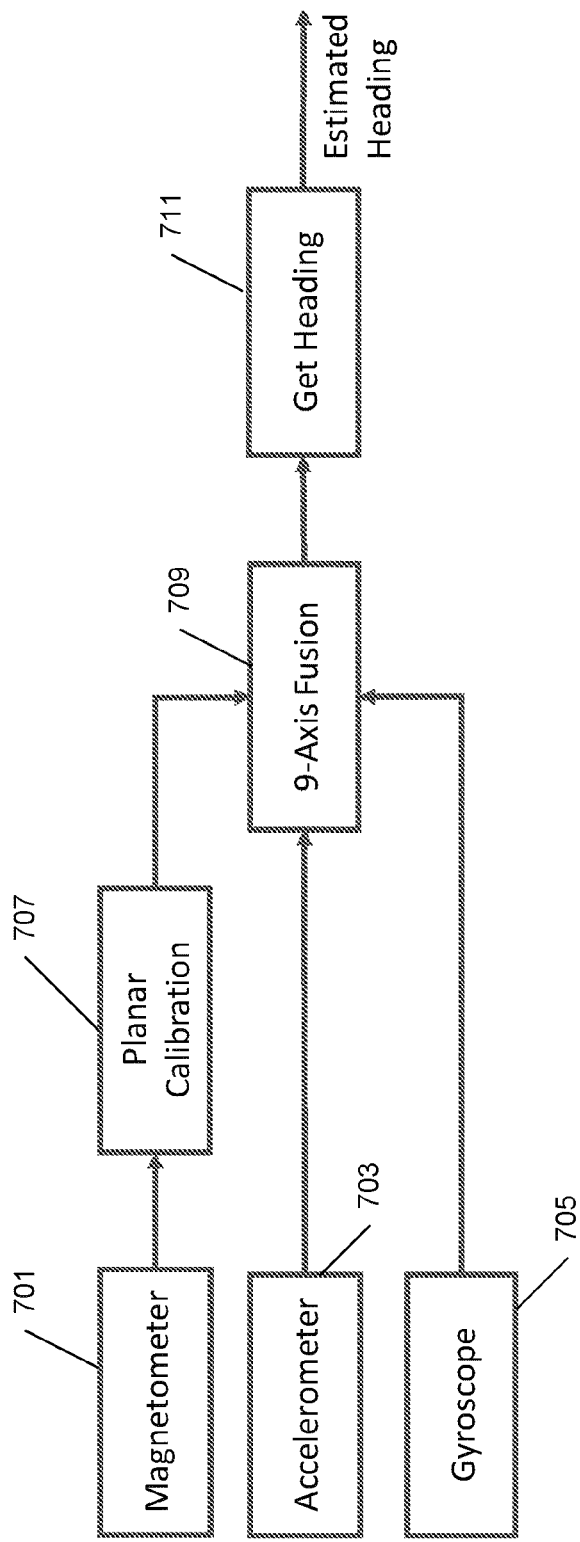
FIG. 7 is a block diagram of one example method for sensor fusion using the calibrated magnetometer.

FIG. 7 is a block diagram of one example method for sensor fusion using the calibrated magnetometer. First, the uncalibrated magnetic field measurement from the magnetometer 701 is input to a planar calibration block 707 that calibrates the magnetic field measurement in accordance with the principles as set forth above in general and/or in accordance with any of the aforedescribed particular embodiments (e.g., circular fit, upright elliptical fit, skewed elliptical fit).

Likewise, the measurements from an accelerometer 703 and a gyroscope 705 also are fed to the 9-axis fusion block 709. Although not expressly shown in FIG. 7, the measurement data from the accelerometer and gyroscope also may be calibrated and otherwise preconditioned before being fed to the 9-axis fusion block 709.

The 9-axis sensor fusion block 709 takes the data from all three sensors and generates an output that is based on a fusion of all of the input data. As previously noted, any 9-axis sensor fusion algorithm may be used, such as the techniques discussed in U.S. Published Patent Application Nos. 2013/0185018 and 2013/0245984. Although not expressly called out in FIG. 7, the 9-axis sensor fusion may include filtering of the sensor measurements, such as filtering of the magnetometer and/or accelerometer measurements by the gyroscope stabilized filter disclosed in U.S. Pat. No. 9,482,554 discussed above in connection with FIG. 6.

Finally, heading block 711 determines a final heading estimate from the fused data from 9-axis fusion block 709.

It will be understood that the functions described above in connection with blocks 707 through 711 may be implemented, for example, in the CPU 130 of FIG. 3.

5. 3-D Magnetometer Calibration

Also disclosed herein are exemplary embodiments of methods, apparatus and systems for improved magnetometer calibration when the body of interest may move freely or relatively freely in all three dimensions.

5.1 Representative System Architectures

Figure 8B:
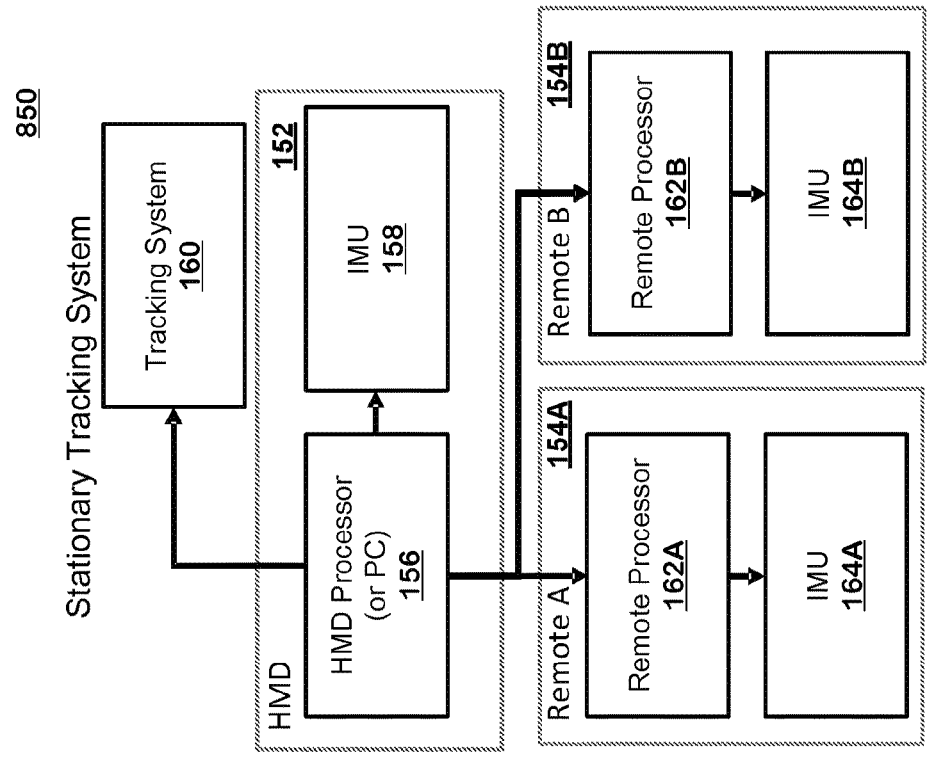
FIGS. 8A and 8B are block diagrams illustrating representative systems in which one or more embodiments may be implemented.
Figure 8A:
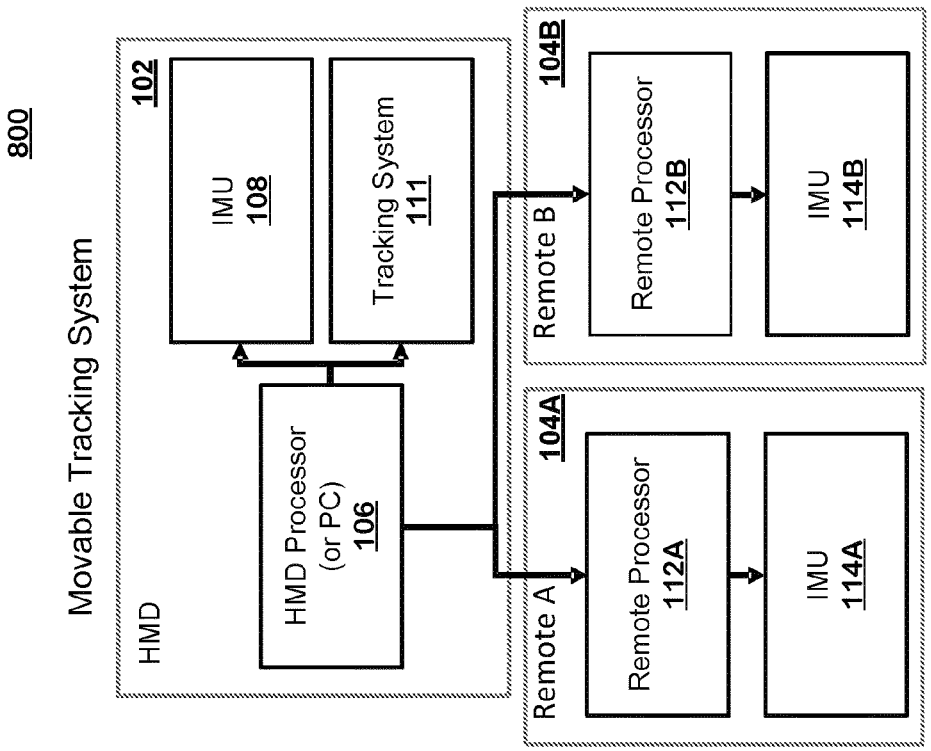

FIG. 8A is a block diagram illustrating a representative system 800 in which one or more embodiments may be implemented. The system 800 may include a head mounted device (HMD) 102 along with first and second associated devices 104A, 104B. The first and second associated devices (hereinafter "remotes") 104A, 104B are remotely located and independently positionable and/or repositionable relative to the HMD 102 and relative to one another. For instance, the remote devices may be hand-held game controllers or other types of devices that work in conjunction with the HMD to provide a user experience, such as a virtual reality experience, to a wearer of the HMD.

The HMD 102 may be configured to provide to a user any of an augmented reality (AR), virtual reality (VR), mixed reality (MR), computer-generated imagery (CGI) and combined CGI and real-world imagery (collectively "adapted reality") experience via a display disposed in or on an inner portion of the HMD 102. The remotes 104A, 104B may appear as objects displayed on the display or otherwise be used in connection with the adapted reality experience.

The HMD 102 may include a processor 106 communicatively coupled with an inertial measurement unit (IMU) 108 and a tracking system 111. The HMD IMU 108 may include a three-axis accelerometer and a three-axis gyroscope, and may output inertial measurement data corresponding to, and/or derived from, measurements made by, the three-axis accelerometer and/or gyroscope. The HMD inertial measurement data may include, for example, an angular position of the HMD 102.

The tracking system 111 may be configured to track one or both of the remotes 104A, 104B, and to output tracking-system measurement data associated therewith. The tracking-system measurement data may include, for example, a three-dimensional (3D) linear position of each of the remotes 104A, 104B.

The tracking system 111 may include one or more cameras and/or a sensor system configured to use any of various tracking signals to carry out the tracking of the remotes 104A, 104B. The tracking system 111 may be mounted or otherwise disposed in or on the HMD 102 so as to allow for transmission and/or reception of the tracking signals via an outward facing portion (the front) of the HMD 102. The tracking signals may be radio frequency signals, electromagnetic signals, acoustic (including ultrasonic) signals, lasers, any combination thereof, and the like. Tracking of the remotes 104A, 104B carried out using the architecture of the system 800 may be referred to herein as "inside-out" tracking. The tracking system 111 may track only a single point on each of the remotes 104A, 104B.

The first and second remotes 104A, 104B may include respective processors 112A, 112B and IMUs 114A, 114B. Like the HMD IMU 108, each of the remote IMUs 114A, 114B may include a three-axis accelerometer and a gyroscope, and may output inertial measurement data corresponding to, and/or derived from, measurements made by, the three-axis accelerometer and/or gyroscope. The remote inertial measurement data output from the remote IMUs 114A, 114B may include, for example, angular positions of the remotes 104A, 104B, respectively.

FIG. 8B is a block diagram illustrating another representative system 850 in which one or more embodiments may be implemented. This embodiment differs from the embodiment illustrated in FIG. 8A at least in that the tracking system is independently located from the HMD and may be stationary. The system 850 may include an HMD 152, a tracking system 160, a first remote 154A and a second remote 154B. The first and second remotes 154A, 154B are remotely located and independently positionable and/or repositionable relative to the HMD 152 and one another. The HMD 152 may be configured to provide to a user an adapted reality (e.g., any of an AR, VR, MR, computer-generated imagery (CGI) and combined CGI and real-world imagery) experience via a display disposed in or on an inner portion of the HMD 152. The remotes 104A, 104B may appear as objects displayed on the display or otherwise used in connection with the adapted reality experience.

The HMD 152 may include a processor 156 communicatively coupled with an IMU 158. The HMD IMU 158 may include a three-axis accelerometer and a three-axis gyroscope, and may output inertial measurement data corresponding to, and/or derived from, measurements made by, the three-axis accelerometer and/or gyroscope. The HMD inertial measurement data may include, for example, an angular position of the HMD 152. The first and second remotes 154A, 154B may include respective processors 162A, 162B and IMUs 164A, 164B. Like the HMD IMU 108 of FIG. 8A, each of the remote IMUs 164A, 164B may include a three-axis accelerometer and a three-axis gyroscope, and may output inertial measurement data corresponding to, and/or derived from, measurements made by, the three-axis accelerometer and/or gyroscope. The remote inertial measurement data output from the remote IMUs 164A, 164B may include, for example, angular positions of the remotes 154A, 154B, respectively.

The tracking system 160 may be mounted stationary in an environment in which the HMD 152 and first and second remotes 154A, 154B are operating. The tracking system 160 may be configured to track the HMD 152 and one or both of the remotes 154A, 154B, and may output tracking-system measurement data associated therewith. The tracking-system measurement data may include, for example, a three-dimensional (3D) linear position of each of the HMD 152 and remotes 154A, 154B. The tracking system 160 may include one or more cameras and/or a sensor system configured to use any of various tracking signals to carry out the tracking of the HMD 152 and remotes 154A, 154B. The tracking signals may be radio frequency signals, electromagnetic signals, acoustic (including ultrasonic) signals, lasers, any combination thereof, and the like. Tracking of the HMD 152 and remotes 154A, 154B carried out using the architecture of the system 850 may be referred to herein as "outside-in" tracking. The tracking system 160 may track only a single point on each of the HMD 152 and the remotes 154A, 154B.

Further details of an IMU, which may be representative of any of the HMD IMUs 158, 108 and the remote IMUs 104A, 104B, 154A, 154B, may be found in application Ser. No. 12/424,090, filed on Apr. 15, 2009; application Ser. No. 11/820,517, filed on Jun. 20, 2007, application Ser. No. 11/640,677, filed Dec. 18, 2006 and which issued on Aug. 28, 2007 as U.S. Pat. No. 7,262,760, application Ser. No. 11/119,719, filed May 2, 2005 and which issued on Jan. 2, 2007 as U.S. Pat. No. 7,158,118, and Provisional Patent Application No. 61/077,238, filed on Jul. 1, 2008; each of which is incorporated herein by reference in its entirety. Also, further details of a tracking system, which may be representative of the tracking systems 850, 800, may be found in application Ser. No. 12/424,090, filed on Apr. 15, 2009.

Although the tracking systems 850, 800 may track a plurality of remotes, for simplicity of exposition herein, any of the remotes 154A, 154B may be referred to herein as "remote 154", and any of the remotes 104A, 104B may be referred to herein as "remote 104". Although the remotes 104, 154 may be configured to be hand held, alternately, they may be mounted to a head, a foot, a robot, an animal or anything else that moves.

5.2 Gyroscope Assisted Magnetometer Amplitude Calibration

As previously mentioned, measurements of a magnetic field (e.g., the earth's magnetic field) performed (e.g., made, sensed, measured, etc.) by a magnetometer may be distorted by magnetic field sources other than the earth, including soft iron and hard iron sources. Hard-iron distortion may be produced by materials that generate a magnetic field different than (e.g., additive to, supplemental to, on top of, etc.) the earth's magnetic field. The hard-iron distortion may generate a constant additive value to an output of a magnetometer. For example, magnetized iron proximate to a magnetometer may generate hard-iron distortion (e.g., a hard-iron effect) that appears in the output of the magnetometer. Further, soft-iron distortion may be produced by materials that influence (e.g., distort, warp) a magnetic field (e.g., the earth's magnetic field), but do not necessarily generate a magnetic field themselves. An amount of soft-iron distortion (e.g., a soft iron effect) may change (for example, a lot) according to an environment of the magnetometer.

A magnetometer may be calibrated to address (e.g., compensate for) hard-iron and/or soft-iron distortion. For example, when using (e.g., only) magnetometer measured data to calibrate a magnetometer, a calibration parameter (e.g., offset, scale, skew, etc.) may be used. Using (e.g., only) magnetometer data may minimize magnetometer calibration dependence on other sensor data. Algorithms that minimize magnetometer calibration dependence on other sensor data (e.g., algorithms that use only magnetometer measured data) may be referred to and/or characterized as "attitude independent" (e.g., see Reference [1]).

According to embodiments, a sensor fusion algorithm may fuse data from an inertial measurement unit (IMU) including a gyroscope (e.g., gyroscope measurements, data, and/or information). According to embodiments, in a case of an IMU and a sensor fusion algorithm, gyroscope data may be used in the magnetometer calibration. For example, using data provided by an IMU and/or a sensor fusion algorithm, magnetometer calibration may be accomplished faster (e.g., less computationally intensively) and may use less measurement data than an attitude independent calibration.

A magnetometer model is shown in Equation (2.1), which is reproduced again below for convenient reference, $$(I+D)h_n = A_n h_0 + b + \varepsilon_n, \quad n=1,2,\ldots,N \quad (2.1)$$

wherein (I+D) is the gain and skew matrix, $h_n$ is the measured body frame magnetic field, $A_n$ is the attitude matrix (3×3 unitary matrix), $h_0$ is the earth frame magnetic field vector (constant, but unknown), b is the offset term, $\varepsilon_n$ is the noise term, and n is the sampling index for time. (See Reference [1], with some variations in Equation (5.1)). In the model of Equation (5.1), the measured body frame magnetic field may be considered to be (e.g., is approximately) a 3D ellipsoid specified by a scale and a skew, and centered at an offset. According to embodiments, a magnetometer obtains (e.g., an estimate of) a gain and skew matrix (I+D) and an offset b.

Note that the true magnetic field in body frame is given by $A_n \cdot h_0$. Here, matrix $A_n = G(q) \cdot R_0$ has two rotations included, as mentioned in section 2.5: the rotation matrix from the user frame to the initial orientation $R_0$, and the rotation matrix G(q) from the initial orientation to the current orientation $q_n$. The initial orientation $R_0$ is, in general, unknown, but the orientation change $G(q_n)$ is usually accurate within a short period (about minutes), as long as the gyroscope is reasonably calibrated. In this subsection, we let $H_0 = R_0 \cdot h_0$, to represent the true body frame magnetic field at starting point, and call G ($q_n$) as $G_n$, then:

$$A_n \cdot h_0 = G(q_n) \cdot R_0 \cdot h_0 = G_n \cdot H_0.$$

The calibration model is given by $$(I+D) \cdot h_n = G_n \cdot H_0 + b + \varepsilon_n, \quad (5.1)$$

According to embodiments, notations used herein are shown in Table 1.

TABLE 1

| Denotation | Unit | Description |
| --- | --- | --- |
| $H_0$ | Gauss | True body frame magnetic field vector at starting point |
| $h_n$ | Gauss | The measurement vector of the magnetic field by the magnetometer including magnetic induction at time step $t_n$ in sensor body coordinate system |

TABLE 1-continued

| Denotation | Unit | Description |
|---|---|---|
| (I + D) | | The symmetric combined scale and skew matrix |
| $G_n$ | | The rotation matrix representing the attitude change of the sensor with respect to the starting orientation. It is generated using gyroscope data and possibly accelerometer data. |
| b | Gauss | The offset vector |
| n | | Sample index |

According to embodiments, the above noted vectors and matrices are shown in Equations (5.2) and (5.3) and vectors below:

$$(I + D) = \begin{bmatrix} D_{11} & D_{12} & D_{13} \\ D_{12} & D_{22} & D_{23} \\ D_{13} & D_{23} & D_{33} \end{bmatrix} \quad (5.2)$$

$$G_n = \begin{bmatrix} G_{11} & G_{12} & G_{13} \\ G_{21} & G_{22} & G_{23} \\ G_{31} & G_{32} & G_{33} \end{bmatrix}, \quad (5.3)$$

$$h_n = \begin{bmatrix} h_{nx} \\ h_{ny} \\ h_{nz} \end{bmatrix}, H_0 = \begin{bmatrix} H_x \\ H_y \\ H_z \end{bmatrix}, b = \begin{bmatrix} b_x \\ b_y \\ b_z \end{bmatrix}, \varepsilon_n = \begin{bmatrix} \varepsilon_x \\ \varepsilon_y \\ \varepsilon_z \end{bmatrix}.$$

To perform attitude independent magnetometer calibration, $G_n$ may be separated from the rest of Equation (5.1). (See References [1], [2], and [3]). However, such attitude independent magnetometer calibration may be (e.g., is often) performed separate from (e.g., any other part of) the sensor fusion algorithm.

According to other embodiments, attitude information may be used to perform magnetometer calibration (hereinafter attitude dependent calibration), For example, attitude information may be used by a sensor fusion algorithm to perform more efficient and faster magnetometer calibration. According to embodiments, in a case of an IMU with available (e.g., available from memory, obtainable from other sensors, etc.) attitude information (e.g., measurement, data, calculation, etc.), such attitude information may be used in a sensor fusion algorithm to generate a more accurate magnetometer heading result. According to embodiments, a magnetometer may use attitude information (e.g., including information obtained from sensors other than the magnetometer) to perform a magnetometer calibration algorithm when performing a sensor fusion algorithm.

According to embodiments, Equation (5.4) is an expansion of Equation (5.1) showing all the vector and matrix elements, as given below:

$$\begin{bmatrix} D_{11} & D_{12} & D_{13} \\ D_{12} & D_{22} & D_{23} \\ D_{13} & D_{23} & D_{33} \end{bmatrix} \cdot \begin{bmatrix} h_{nx} \\ h_{ny} \\ h_{nz} \end{bmatrix} - \begin{bmatrix} G_{11} & G_{12} & G_{13} \\ G_{21} & G_{22} & G_{23} \\ G_{31} & G_{32} & G_{33} \end{bmatrix} \cdot \begin{bmatrix} H_x \\ H_y \\ H_z \end{bmatrix} - \quad (5.4)$$

$$\begin{bmatrix} b_x \\ b_y \\ b_z \end{bmatrix} = \begin{bmatrix} \varepsilon_x \\ \varepsilon_y \\ \varepsilon_z \end{bmatrix}.$$

In Equation (5.4), vector $h_n$ is a magnetometer measurement, and matrix $G_n$ is obtained from gyroscope data. The 12 variables in matrix (I+D), vector $H_0$, and vector b are the parameters that need to be calibrated.

According to embodiments, the left side of Equation (5.4) may be as close to 0 as possible. For example, Equation (5.4) may be expressed as:

$$\begin{bmatrix} D_{11} & D_{12} & D_{13} \\ D_{12} & D_{22} & D_{23} \\ D_{13} & D_{23} & D_{33} \end{bmatrix} \cdot \begin{bmatrix} h_{nx} \\ h_{ny} \\ h_{nz} \end{bmatrix} - \begin{bmatrix} G_{11} & G_{12} & G_{13} \\ G_{21} & G_{22} & G_{23} \\ G_{31} & G_{32} & G_{33} \end{bmatrix} \cdot \begin{bmatrix} H_x \\ H_y \\ H_z \end{bmatrix} - \begin{bmatrix} b_x \\ b_y \\ b_z \end{bmatrix} = \begin{bmatrix} 0 \\ 0 \\ 0 \end{bmatrix}.$$

According to embodiments, adding vector $h_n$ to both sides of Equation (5.4) expressed above may formulate the problem to a Least Square Fitting problem, expressed as Equation (5.5) below:

$$\begin{bmatrix} 1+D_{11} & D_{12} & D_{13} \\ D_{12} & 1+D_{22} & D_{23} \\ D_{13} & D_{23} & 1+D_{33} \end{bmatrix} \cdot \begin{bmatrix} h_{nx} \\ h_{ny} \\ h_{nz} \end{bmatrix} - \begin{bmatrix} G_{11} & G_{12} & G_{13} \\ G_{21} & G_{22} & G_{23} \\ G_{31} & G_{32} & G_{33} \end{bmatrix} \cdot \begin{bmatrix} H_x \\ H_y \\ H_z \end{bmatrix} - \quad (5.5)$$

$$\begin{bmatrix} b_x \\ b_y \\ b_z \end{bmatrix} = \begin{bmatrix} h_{nx} \\ h_{ny} \\ h_{nz} \end{bmatrix}.$$

According to embodiments, a parameter vector K may be defined as shown in Equation (5.6) below:

$$K = [1+D_{11}\ D_{12}\ D_{13}\ 1+D_{22}\ D_{23}\ 1+D_{33}\ H_x\ H_y \quad (5.6)$$
$$H_z\ b_x\ b_y\ b_z]',$$

and a matrix $T_n$, and vector $U_n$ for n-th sample with known variables may be defined as respectively shown in Equations (5.7) and (5.8) below:

$$T_n = \begin{bmatrix} h_{nx} & h_{ny} & h_{nz} & 0 & 0 & 0 & -G_{11} & -G_{12} & -G_{13} & -1 & 0 & 0 \\ 0 & h_{nx} & 0 & h_{ny} & h_{nz} & 0 & -G_{21} & -G_{21} & -G_{23} & 0 & -1 & 0 \\ 0 & 0 & h_{nx} & 0 & h_{ny} & h_{nz} & -G_{31} & -G_{32} & -G_{33} & 0 & 0 & -1 \end{bmatrix}, \quad (5.7)$$

$$U_n = \begin{bmatrix} h_{nx} \\ h_{ny} \\ h_{nz} \end{bmatrix}. \tag{5.8}$$

According to embodiments, Equation (5.5) in view of Equations (5.6)-(5.8), may be expressed (e.g., in a linear format) as shown below in Equation (5.9) below:

$$T_n \times K = U_n. \tag{5.9}$$

According to embodiments, a matrix T (3N×12) may be generated (e.g., built, configured as, etc.) by concatenating $T_n$. For example, in the case of Equation (5.5) being expressed in the linear format shown in Equation (5.9), matrix T (3N×12) may be built from concatenating $T_n$ for all samples n=1,2, ..., N, as shown in Equation (5.10) below. According to embodiments, a vector U (3N×1) may be generated (e.g., built, configured as, etc.) by concatenating $U_n$. For example, in the case of Equation (5.5) being expressed in the linear format shown in Equation (5.9), vector U (3N×1) may be built from concatenating $U_n$ for all samples n=1,2, ..., N, as shown in Equation (5.10) below.

$$T \times K = U, \text{ with } T = \begin{bmatrix} T_1 \\ \vdots \\ T_N \end{bmatrix}, U = \begin{bmatrix} U_1 \\ \vdots \\ U_N \end{bmatrix}. \tag{5.10}$$

According to embodiments, Equation (5.10) may be solved using a least square optimization method, as shown in Equation (5.11) below:

$$\tilde{K} = \text{pinv}(T) * U = (T'T)^{-1} \times (T'U), \tag{5.11}$$

wherein pinv(T) is the pseudo-inverse of T.

According to embodiments, the resulting matrix $\tilde{K}$, as shown in Equation (5.11), may be used to generate a scale and skew matrix (I+D) and offset b, as shown below in Equation (5.12):

$$(I+D) = \begin{bmatrix} K_1-1 & K_2 & K_3 \\ K_2 & K_4-1 & K_5 \\ K_3 & K_5 & K_6-1 \end{bmatrix}, b = \begin{bmatrix} K_{10} \\ K_{11} \\ K_{12} \end{bmatrix}. \tag{5.12}$$

According to embodiments, the least square optimization shown in Equation (5.11) may be solved using an iterative method. For example, Equation (5.11) may be solved without saving (e.g., without needing to save) a matrix T and a vector U, as only values T'T and T'U respectively shown in Equations (5.13) and (5.14) below, may be saved (e.g., may need to be saved).

$$T'T = \sum_{n=1}^{N} T_n' \cdot T_n, \tag{5.13}$$

$$T'U = \sum_{n=1}^{N} T_n' \cdot U_n. \tag{5.14}$$

Figure 9:
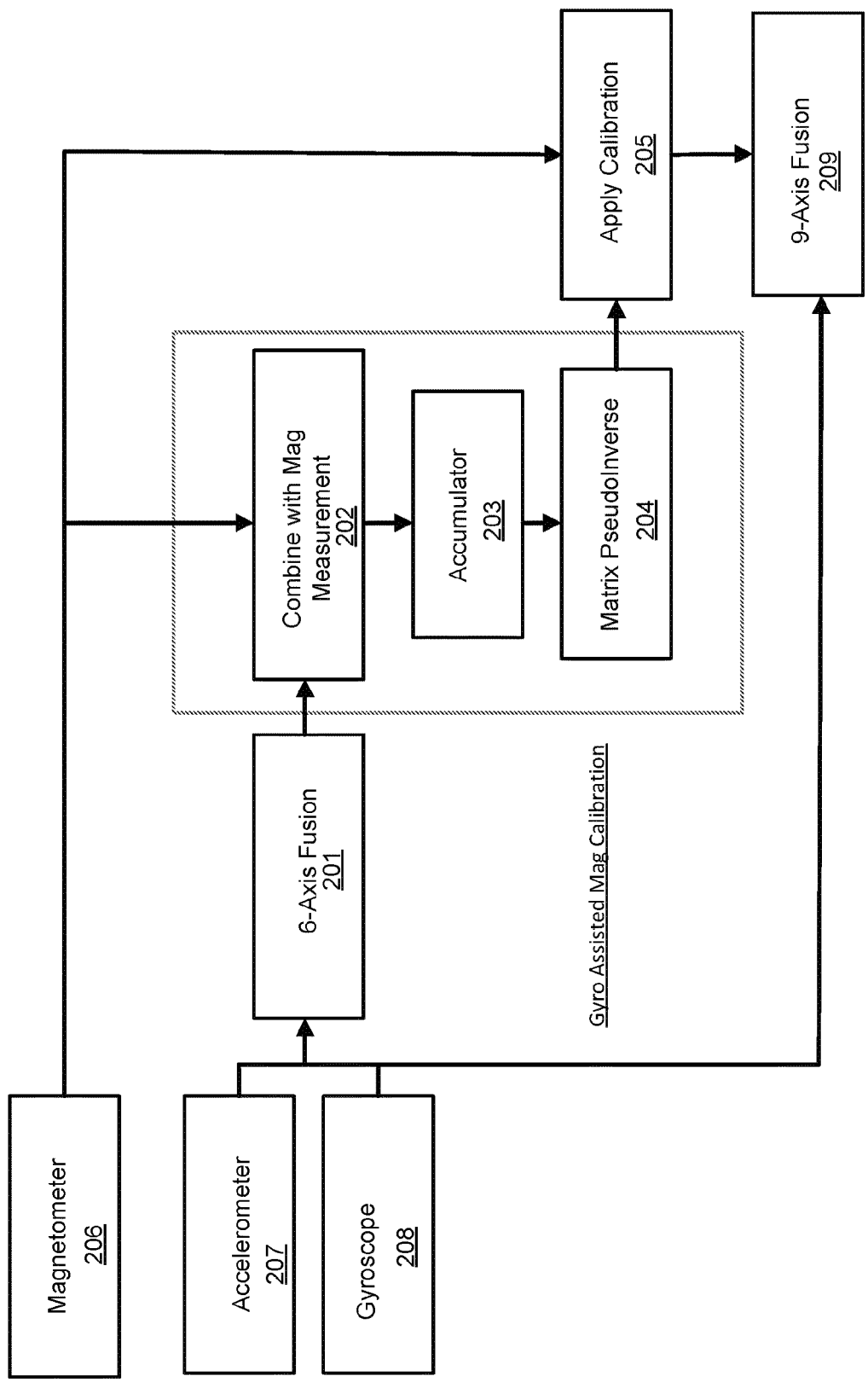
FIG. 9 is a diagram illustrating a sensor fusion system configured for performing magnetometer calibration according to embodiments.

FIG. 9 is a diagram illustrating a sensor fusion system configured for performing magnetometer calibration according to embodiments using the principles discussed hereinabove in this section.

According to embodiments, a system for calibrating a magnetometer may include a gyroscope 208, an accelerometer 207, and the magnetometer 206. According to embodiments, gyroscope assisted magnetometer calibration may be performed using a device angular position from one or more gyroscopes (e.g., as an input). According to embodiments, the device angular position may be obtained from a 6-axis sensor fusion algorithm 201, as shown in FIG. 9. As previously mentioned, 6-axis sensor fusion algorithms (e.g., using the outputs of 3 mutually orthogonal accelerometers and 3 mutually orthogonal gyroscopes) are known in the related arts.

According to embodiments, at operation 201 shown in FIG. 9, 6-axis fusion information may be generated. At operation 202, the 6-axis fusion information may be combined with a magnetometer measurement. For example, as discussed above, magnetometer information expressed in vector $h_n$ and rotation matrix $G_n$ were used to form matrix $T_n$ and vector $U_n$, as shown in Equations (5.7) and (5.8). At operation 203, an accumulator may use the combined information to accumulate values for a matrix and a vector. For example, as discussed above with respect to Equations (5.6)-(5.10), T'T (12×12) and vector T'U (12×1) may be built by the accumulator 203.

At operation 204, a matrix pseudo-inverse operation may be performed to generate another matrix. For example, as shown in Equation (5.11), the resulting matrix $\tilde{K}$ may be obtained using a pseudo-inverse of matrix T. Further, the resulting matrix $\tilde{K}$ may be used to generate a scale and skew matrix (I+D) and offset b, as shown above in Equation (5.12). At operation 205, a calibration may be applied to the magnetometer (e.g., the calibration may be used to correct a magnetometer measurement). For example, the scale and skew matrix (I+D) and offset b may be used to calibrate the magnetometer measurement. At operation 205, calibrated magnetometer information, along with accelerometer and gyroscope information, may be used for 9-axis fusion. According to embodiments, the system of FIG. 9 may provide magnetometer calibration using an attitude matrix and magnetometer data to solve the scale, skew, and offset parameters.

6. Magnetometer Alignment Calibration

As seen in the preceding section, magnetometer data may be fused with other sensor data according to a relative orientation (e.g., an alignment angle) between a gyroscope and a magnetometer. However, computation of the relative orientation may be difficult or complex. As such, the relative orientation may be (e.g., is often) assumed to be a constant angle (as was the assumption in the mathematical calculations in section 5 above), for example a known (e.g., configured, calibrated, etc.) angle (e.g., 0°, 1°, 90°, etc.) provided by a manufacturer. Further, there may be an alignment error (e.g., manufacturing error) resulting in some variation between an actual alignment angle and the alignment angle provided by the manufacturer (e.g., in the manufacturer's datasheet). The alignment error may degrade a sensor fusion algorithm's heading accuracy, which should not be ignored in any high-fidelity sensor fusion algorithm.

A magnetometer model (see Equation (2.1)) may account for (e.g., be configured to include) a misalignment error. For example, the magnetometer model of Equation (2.1) may be expressed to include the alignment error, as shown below in Equation (6.1):

$$(I+D)h_n = R \cdot A_n H_0 + b + \varepsilon_n, \ n=1,2,\ldots,N \tag{6.1}$$

wherein (I+D) are the scale-skew matrix of the magnetometer, $h_n$ is the magnetometer measurement data, R is a misalignment matrix (which may also be referred to as an alignment matrix), $A_n$ is the attitude matrix, $h_0$ is the earth magnetic field vector, b is the magnetometer offset, and $\varepsilon_n$ is the noise term.

A magnetometer amplitude calibration algorithm (e.g., see Reference [1]) may solve for the magnetometer amplitude calibration parameters (I+D) and b by assuming the alignment matrix R to be an identity or known matrix. In such a case, after amplitude calibration, the magnetic field vector may be as shown in Equation (6.2) below:

$$\tilde{h}_n = (I+D) \cdot h_n - b. \quad (6.2)$$

However, the alignment matrix R may not be an identity or a known matrix. For example, the assumption that the alignment matrix R is an identity or known matrix may not be true or correct because of mounting issues or manufacture issues, which may result in several degrees of alignment errors. For a high-fidelity sensor fusion algorithm, even a few degrees of error may (e.g., greatly) downgrade sensor fusion algorithm performance.

According to embodiments, a magnetometer alignment calibration algorithm (which may also be referred to as a magnetometer calibration algorithm) may use an alignment matrix R to perform magnetometer calibration. According to embodiments, a magnetometer alignment calibration algorithm may include an algorithm for determining an alignment matrix R. According to embodiments, Equations (6.1) and (6.2) may be combined as shown in Equation (6.3):

$$R^{-1} \cdot \tilde{h}_n = A_n \cdot h_0 + \varepsilon_n. \quad (6.3)$$

According to embodiments, an algorithm for determining an alignment matrix R may be based on Equation (6.3).

Figure 10:
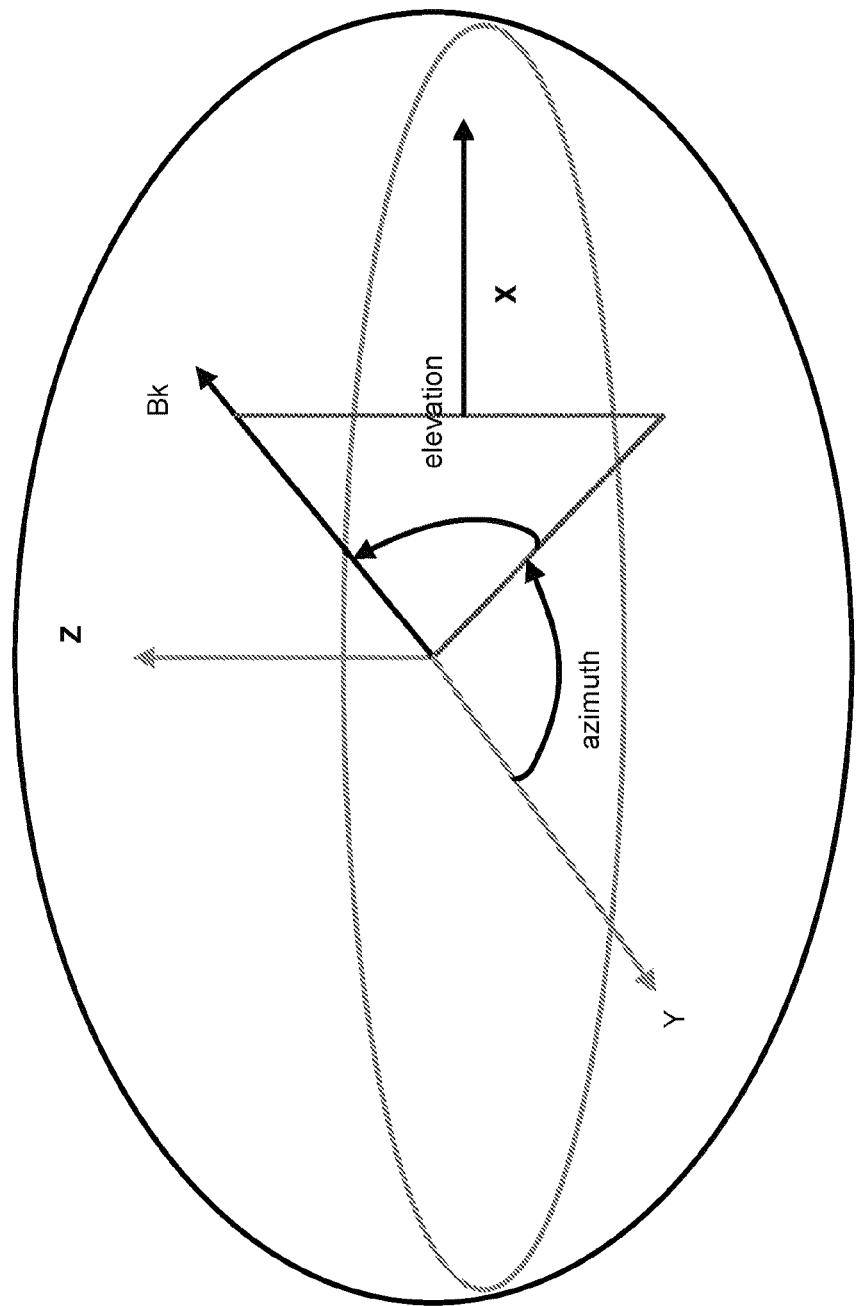
FIG. 10 is a diagram illustrating azimuth and elevation angles for an earth magnetic field $h_0$ in the earth North-East-Down frame according to embodiments.

FIG. 10 is a diagram illustrating azimuth and elevation angles for an earth magnetic field in the earth North-East-Down frame according to embodiments.

According to embodiments, an environment may be assumed, without a loss of generality, wherein a magnetic vector has a constant strength and a constant orientation. According to embodiments, such a magnetic vector, in a spherical coordinate system as shown in FIG. 10, may be expressed as shown below in Equation (6.4) below:

$$h_0 = \begin{bmatrix} \theta_0 \\ \varphi_0 \\ 1 \end{bmatrix}, \quad (6.4)$$

wherein $\theta_0$ is the azimuth angle and $\varphi_0$ is the elevation angle (e.g., dip angle), as shown in FIG. 10.

According to embodiments, azimuth angle $\theta_0$ and elevation angle $\varphi_0$ may be estimated. For example, azimuth angle $\theta_0$ and elevation angle $\varphi_0$ may be estimated for a nonlinear least-squares estimation algorithm used for a magnetometer alignment calibration algorithm discussed above.

A method for estimating a misalignment matrix R according to embodiments is discussed below. According to embodiments, a magnetic field vector v may be defined as shown in Equation (6.5) below:

$$v = \begin{bmatrix} \cos\varphi_0 \cdot \cos\theta_0 \\ \cos\varphi_0 \cdot \sin\theta_0 \\ \sin(\varphi_0) \end{bmatrix}. \quad (6.5)$$

The magnetic field vector v is given in (e.g., may be considered to be in) a user frame and may be indicated (e.g., represented) by the azimuth angle $\theta_0$ and elevation angle $\varphi_0$. According to embodiments, any of the azimuth angle $\theta_0$ and elevation angle $\varphi_0$ may be estimated. According to embodiments, the vector v may have (e.g., may be assumed to have) an amplitude of 1 Gauss.

According to embodiments, the magnetic field in the body frame may be obtained by rotating the magnetic field vector v from its user frame to the body frame version. For example, the magnetic field in the body frame may be obtained by using the orientation of the body frame q, as shown in Equation (6.6) below:

$$t = q^* \otimes v \otimes q, \quad (6.6)$$

wherein, notation $\otimes$ means quaternion multiplication. According to embodiments, vector t is a value that the magnetometer measures (e.g., should measure in a case where the scale, skew and offset are known). For example, the magnetometer should measure vector t in a case where there is no misalignment between the sensor frame and magnetometer frame. In such a case, when there is no noise, vector t may represent the vector in the right side of Equation (6.3) (e.g., $(A_n \cdot h_0)$).

According to embodiments, amplitude-calibrated magnetic vector $\tilde{h}_n$ may be defined (e.g., redefined) as (e.g., a new) measurement $M_n$ (3×1). According to embodiments, measurement $M_n$ (3×1) may be related to the true magnetic field vector $t_n$ (3×1) as expressed in Equation (6.7) below:

$$Q \cdot M_n = t_n + p + \varepsilon_n. \quad (6.7)$$

According to embodiments, a matrix Q (3×3) may be generated as a result of combining the misalignment matrix R and the residual scale and skew from the amplitude calibration. According to embodiments, the vector p (3×1) may be the residual offset after amplitude calibration.

According to embodiments, in a case where vectors $M_n$ and $t_n$ are known, parameter Q and vector p may be obtained by minimizing an error between measured magnetometer vector $t_n$ and alignment calibrated magnetic field vector $(Q \cdot M_n - p)$. According to embodiments, measured magnetometer vector $t_n$ may be expressed as shown below in Equation (6.8):

$$t_n = Q \cdot M_n - p. \quad (6.8)$$

According to embodiments, Equation (6.8) may have a transpose added to both sides and may be rearranged as shown below in Equation (6.9):

$$t'_n = M'_n \cdot Q' - p' = [M'_n - 1]\begin{bmatrix} Q' \\ p' \end{bmatrix}, \quad (6.9)$$

wherein Equation (6.9) is for an $n^{th}$ sample. According to embodiments, in a case of N such samples, Equations (6.8) and (6.9) may be put together to obtain Equation (6.10) shown below:

$$M \cdot K = T, \quad (6.10)$$

wherein, concatenated measurements matrixes T(N×3) and M(N×4) and parameter matrix K (4×3) may be defined as shown below:

$$T = \begin{bmatrix} t'_1 \\ \vdots \\ t'_N \end{bmatrix}, M = \begin{bmatrix} M'_1 & -1 \\ & \vdots \\ M'_N & -1 \end{bmatrix}, K = \begin{bmatrix} Q' \\ p' \end{bmatrix}.$$

According to embodiments, a least square solution for Equation (6.10) is shown below as Equation (6.11):

$$K = \text{pinv}(M) \cdot T = (M'M)^{-1} \cdot (M'T) \quad (6.11)$$

According to embodiments, residual scale and skew may be ignored, and a misalignment matrix R may be the top 3 rows of matrix K.

According to embodiments, the least square solution of Equation (6.10) may be solved using an iterative method. According to embodiments, a magnetometer alignment calibration algorithm may solve the least square solution of Equation (6.10) using (e.g., only) the values M'M (4×4) and M'T (4×3), which may be respectively accumulated as shown below in Equations (6.12) and (6.13). For example, the least square solution of Equation (6.11) may be solved without (e.g., the need for) saving matrix T and M, as only M'M and M'T may be (e.g., need to be) saved.

$$M'M = \begin{bmatrix} \sum_{n=1}^{N} M_n \cdot M'_n & -\sum_{n=1}^{N} M_n \\ -\sum_{n=1}^{N} M'_n & N \end{bmatrix} \quad (6.12)$$

$$M'T = \begin{bmatrix} \sum_{n=1}^{N} M_n \cdot t'_n \\ -\sum_{n=1}^{N} t'_n \end{bmatrix}. \quad (6.13)$$

Figure 11:
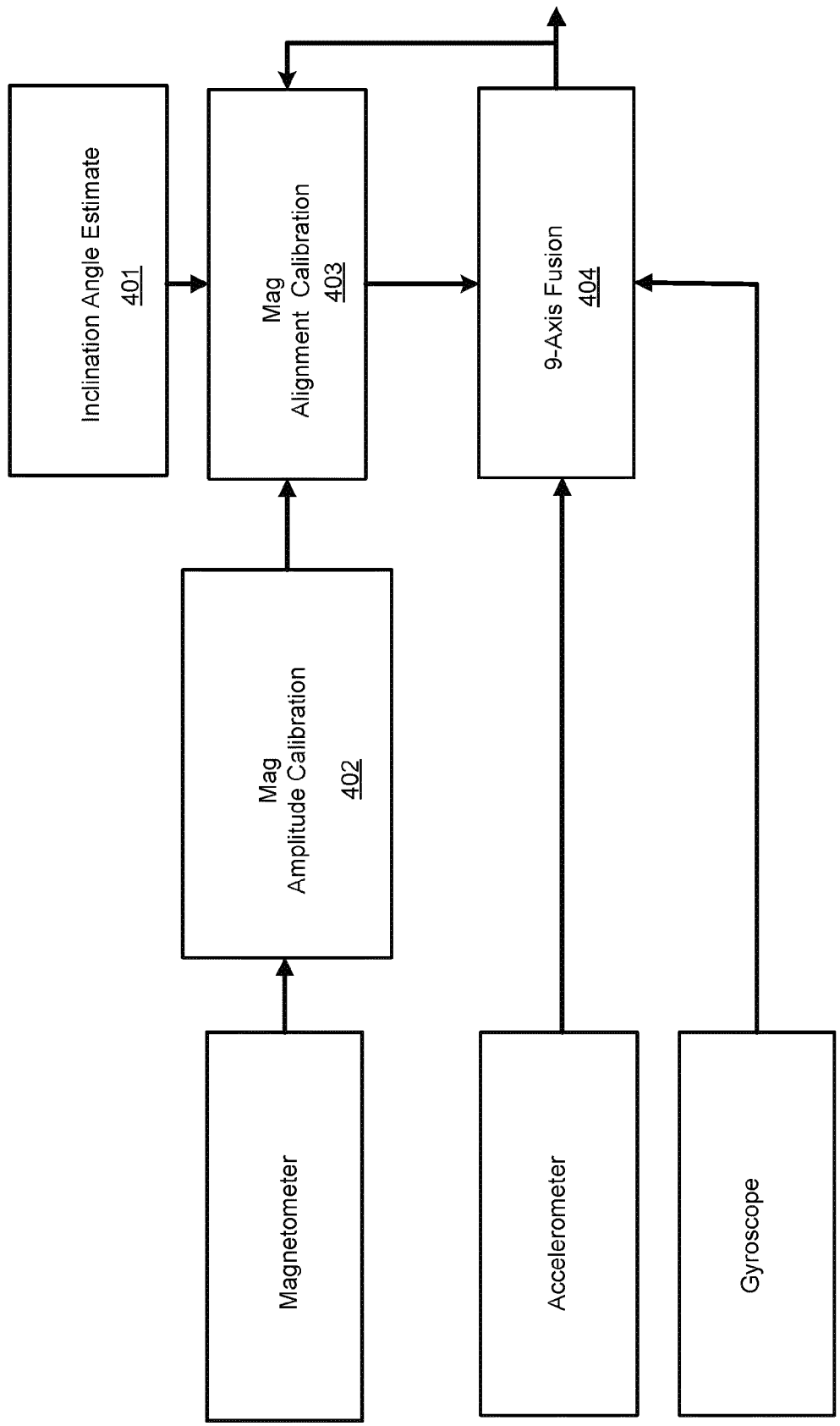
FIG. 11 illustrating a sensor fusion system configured for performing magnetometer calibration according to embodiments.

FIG. 11 illustrating a sensor fusion system configured for performing magnetometer calibration according to embodiments.

According to embodiments, a magnetometer alignment calibration algorithm may use (e.g., may need) a device angular position as an input. According to embodiments, device angular position may be obtained using (e.g., from) a 9-axis sensor fusion algorithm. According to embodiments, a magnetometer alignment calibration algorithm may use (e.g., may need) an inclination angle of an amplitude calibrated earth magnetic field as an input, and may further use the amplitude calibrated earth magnetic field as an input.

According to embodiments, a sensor fusion system may calibrate a magnetometer as shown in FIG. 11. According to embodiments, at operation 401, an inclination angle estimate may be generated (from all three types of sensors accelerometer, gyroscope, magnetometer). At operation 402, a magnetometer amplitude calibration may be performed. For example, a magnetometer amplitude calibration may be performed as discussed above with reference to Equations (6.1) and (6.2). At operation 403, magnetometer alignment calibration may be performed using any of the inclination angle estimate, magnetometer amplitude calibration information, and 9-axis fusion information. For example, magnetometer alignment calibration may be performed as discussed above with reference to Equations (6.8)-(6.13). At operation 404, magnetometer calibration information may be used to perform 9-axis fusion.

Figure 12:
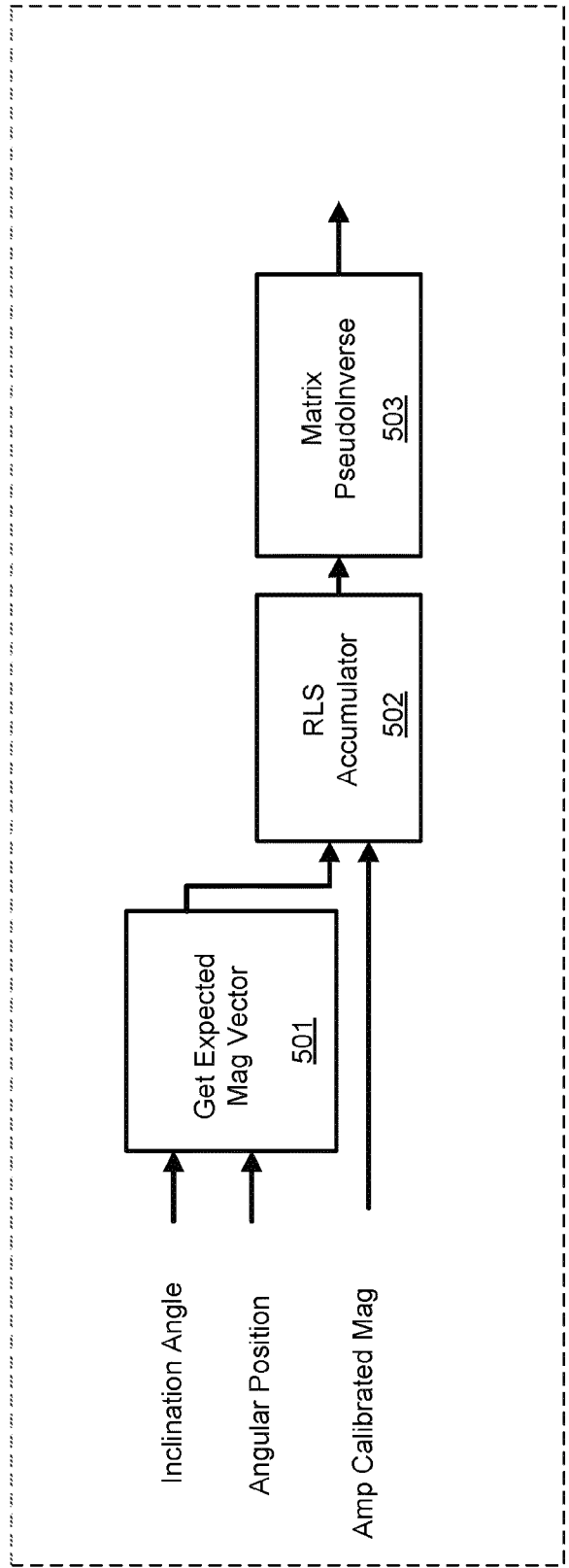
FIG. 12 is a diagram illustrating a method for magnetometer alignment calibration according to embodiments.

FIG. 12 is a diagram illustrating a method for magnetometer alignment calibration according to embodiments, and shows the detail for step 403 in FIG. 11.

According to embodiments, at operation 501 shown in FIG. 12, an inclination angle and an angular position may be used to generate an estimated earth magnetic field vector (e.g., to get an expected earth magnetic field vector). At operation 502, an RLS accumulator may use the estimated earth magnetic field vector and amplitude calibrated magnetometer information to accumulate values for a matrix and a vector. For example, as discussed above with respect to Equations (6.8)-(6.11), concatenated measurements matrixes T(N×3) and M(N×4) and parameter matrix K (4×3) may be built by the RLS accumulator.

At operation 503, a matrix pseudo-inverse may be performed to generate another matrix. For example, as shown in Equation (6.11), the matrix K may be obtained using a pseudo-inverse of matrix M. Further, the matrix K may be used to generate a misalignment matrix R, which may be the top 3 rows of matrix K, and wherein a residual scale and skew may be ignored.

According to embodiments, a sensor fusion system (e.g., as shown in FIGS. 11 and 12) may calibrate a magnetometer measurement according to a magnetometer alignment matrix relative to a gyroscope.

7. Magnetometer Mapping

In a case where a magnetometer is used to determine a yaw value, a magnetometer amplitude may be (e.g., may be required to be) calibrated to compensate for soft iron and hard iron errors. After the magnetometer amplitude is calibrated such as disclosed above in section 5 or section 6, the calibrated magnetometer data may be used to compute a yaw angle of the device.

Assuming, as is likely, that the magnetometer calibration is not absolutely perfect and that the magnetic field varies in space, the measured earth frame magnetic vector may walk (e.g., rotate, swing, move, etc.) around its ideal center as the device orientation varies. This magnetometer vector walking may cause yaw uncertainty and/or an abrupt change in (e.g., a jump in an output of) the sensor fusion algorithm as the device orientation varies. For example, let us assume that a smart phone rests on a table and its top is pointing north and that it has an alignment error that causes the magnetic field determination to be off by −5 degree in the smart phone's frame. In such a case, after the smart phone is flipped upside down, the alignment error may cause the magnetic field to now be off by +5 degrees in the smart phone's frame; thus, even though the device is pointing in the same direction, the heading of the magnetic field may jump from −5 degrees to 5 degrees abruptly.

Uncertainty and/or abrupt change may result in an incorrect computation of an orientation and/or an attitude of a device. That is, after a magnetometer is calibrated, there may be two errors (e.g., types of errors) to be addressed: (1) an imperfect magnetometer calibration, and (2) a spatially non-uniform magnetic field. Further, in the case of combining magnetometer data with gyroscope and accelerometer data, for example, by a sensor fusion algorithm, accuracy of magnetometer data may affect (e.g., is very critical to) performance of the sensor fusion algorithm.

According to embodiments, a sensor fusion algorithm may use magnetometer mapping (also referred to as magnetic field mapping) to correct for errors associated with any of: (1) an imperfect magnetometer calibration, and (2) a spatially non-uniformly distributed magnetic field. According to embodiments, a sensor fusion algorithm may generate a survey of the earth magnetic field and may build a reference map of magnetometer output reading as a function of orientation (angular position). According to embodiments, a sensor fusion algorithm may make corrections to a reference map according to a survey of the earth magnetic field.

According to embodiments, a sensor fusion algorithm may be used to calibrate the magnetometer for variations in magnetic field as a function of orientation (wherein spatial variations in magnetic field are assumed to be subsumed within the variations in magnetic field observed as a function of orientational variations). According to embodiments, such a sensor fusion algorithm may reduce (e.g., prevent, map out, compensate, etc.) yaw uncertainty and/or jumps in the heading determination. According to embodiments, a sensor fusion algorithm may increase yaw accuracy, for example, to solve the magnetic vector walking problem. According to embodiments, a sensor fusion algorithm may map out errors introduced by any of an imperfect magnetometer calibration or an orientation-variant (e.g., as a function of orientation) magnetic field. According to embodiments, a sensor fusion algorithm may assume that the magnetic field variation as a function of time during the mapping and correction process is negligible.

According to embodiments, a sensor fusion algorithm may operate according to any of the following assumptions: (1) the magnetic field is not time varying (e.g., the magnetic field variation over time is negligible during execution/ operation of the sensor fusion algorithm); and (2) any changes in the magnetic field resulting from location variations is subsumed within the magnetic field changes resulting from orientation variations.

According to embodiments, the following notations, shown below in Table 2, are used herein.

may be corrected according to the corresponding reference cluster. According to embodiments, a 9-axis sensor fusion algorithm may fuse a corrected magnetic field vector (e.g., corresponding to the corrected magnetometer measurements).

7.1 Reference Quaternion

According to embodiments, a reference quaternion sequence may be obtained before performing magnetometer mapping. For example, before performing a sensor fusion algorithm, a reference quaternion sequence may be obtained from memory (e.g., offline, configured, etc.). According to embodiments, a reference quaternion sequence may be chosen (e.g., selected, configured, etc.) to be equally and/or uniformly distributed in a quaternion space. For example, a reference quaternion sequence may be uniformly distributed in a space such that the minimum angular rotation between any two quaternion points in the sequence is maximized. According to embodiments, for a reference quaternion sequence, the greater the number of quaternion points, the smaller the angular distance between any two quaternion points. According to embodiments, a reference quaternion sequence may include 144 quaternion points. For example, a reference quaternion sequence having 144 quaternion points may provide a balance between density of reference points and computational complexity required to search for a closest reference.

According to embodiments, a reference quaternion sequence may be generated as described in Reference [3]. However, the present disclosure is not limited thereto, and

TABLE 2

| Notation | Meaning |
|---|---|
| 6-axis | Six axes' sensor data including 3 axes of gyroscope data and 3 axes of accelerometer data |
| 9-axis | Nice axes' sensor data including 3 axes of gyroscope, and 3 axes of accelerometer and 3 axes magnetometer data |
| $q_{6\_AG}$ | Quaternion computed from gyroscope and accelerometer fusion algorithm using 6 axis data |
| $q_{9\_AGM}$ | Quaternion computed from gyroscope, accelerometer and magnetometer fusion algorithm using 9 axis data |
| magEarth | Magnetic vector in the Earth frame, referenced to gravity and magnetic North (or True North, if the current declination angle is known). |
| magBody | Original magnetic vector in the body frame which refers to the body frame of a sensor or the IMU |
| $magBody_{corrected}$ | Corrected magnetic vector in the body frame (of a sensor or the IMU |
| magIn | Calibrated body frame magnetic vector measurement |
| azimuth | azimuth has also been more generally defined as a horizontal angle measured clockwise from any fixed Earth reference frame (usually East-North-Up frame). |
| REFERENCE_Q_LENGTH | The number of reference quaternion sequences (144 is chosen in the discussion below) |
| clusterCenter[k] | The object that holds the running mean of azimuth value for the k-th cluster, k = 1, 2, . . . REFERENCE_Q_LENGTH |
| addSample( ) | A function for clusterCenter object defined above to store the input into the array element |

According to embodiments, a sensor fusion algorithm may: (1) build a sequence of reference clusters; and (2) correct a magnetometer reading based on the reference clusters. According to embodiments, reference clusters may be generated using a quaternion sequence, such as a predefined quaternion sequence equally distributed in a quaternion space. According to embodiments, an azimuth angle computed from magnetometer measurements may be used to calibrate a magnetic field vector, and the calibrated magnetic vector may be placed into a corresponding reference cluster. According to embodiments, magnetometer measurements any collection of reference quaternion points that are uniformly distributed in a space (e.g., roughly, evenly, approximately equally distributed in a space) may be used.

7.2 Reference Map

According to embodiments, a reference map may be generated according to any of the following assumptions: (1) a quaternion is available from the fusion of gyroscope and accelerometer data (for example, which may be available for any 6-axis sensor fusion algorithm, and the quaternion may be denoted as $q_{6\_AG}$; and (2) magnetometer data is subject to walking due to imperfect calibration and/or a spatially non-uniform magnetic field.

According to embodiments, a reference map may be built according to the following operations. According to embodiments, in the case of a current input being the 6-axis quaternion $q_{6\_AG}$, a first operation may be to search for the index of the closest reference cluster from the reference cluster set, as shown below:

```
allDistance[REFERENCE_Q_LENGTH] = 0;
smallestIndex = 0;
smallestDistance = allDistance[0];
for (int i = 0; i < REFERENCE_Q_LENGTH; i++) {
        allDistance[i] = getAngularDistance(q6_AG, qRef[i]);
        if (allDistance[i] < smallestDistance) {
            smallestDistance = allDistance[i];
            smallestIndex = i;
        }
}
```

According to embodiments, the function getAngularDistance(q1,q2) calculates a minimum angle among all rotations from quaternion q1 to quaternion q2, and may indicate a distance between the two quaternions. According to embodiments, a second operation may be to rotate the current calibrated magnetic vector magIn back to the Earth frame, as shown in Equation (7.1) below, and may be to compute an azimuth angle, as shown in Equation (7.2) below:

$$magEarth = qvrot(q6\_AG, magIn), \quad (7.1)$$

$$currentAzimuth = atan2(magEarth_y, magEarth_x). \quad (7.2)$$

According to embodiments, qvrot(q, v) may be a function to rotate body frame vector v to the earth frame, and may be defined as follows:

$$qvrot(q, v) = q \otimes v \otimes q^*,$$

wherein, q is a 4×1 quaternion, v is a 3×1 vector, and ⊗ indicates (e.g., means, is defined as a) quaternion multiplication.

According to embodiments, a third operation may be to add the currentAzimuth sample (e.g., from the second operation) into the cluster running mean object with index smallestIndex (e.g., from the first operation), as shown below in Equation (7.3).

$$clusterCenter[smallestIndex].addSample \\ (currentAzimuth) \quad (7.3)$$

According to embodiments, the above described first through third operations may be repeated for any number of (e.g., for all incoming, received, measured, etc.) samples. According to embodiments, as more and more motion occurs, more clusters are populated. According to embodiments, each clusterCenter may keep track of a mean and variance of the added samples. According to embodiments, when the mean of a cluster is statistically accurate (e.g., when the variance drops below a certain threshold and/or a statistically significant number of samples has been acquired), it may be used to correct magnetometer data. According to embodiments, to handle a slowly varying magnetic environment (e.g., a slowly drifting 6-axis quaternion reference), samples from further back in time may (e.g., should) be given a smaller weight than samples that are closer back in time for the mean calculation. For example, sample weights may be adjusted according to a forgetting factor of (e.g., associated with) each sample. For example, the weight of each sample may gradually diminish as time goes on, and thus, newer samples may have larger weights.

7.3 Magnetometer Correction

According to embodiments, original body frame magnetometer data, magIn, may be corrected after a reference map has been obtained (e.g., generated). According to embodiments, corrected magnetometer data may be used by a sensor fusion algorithm.

Figure 13:
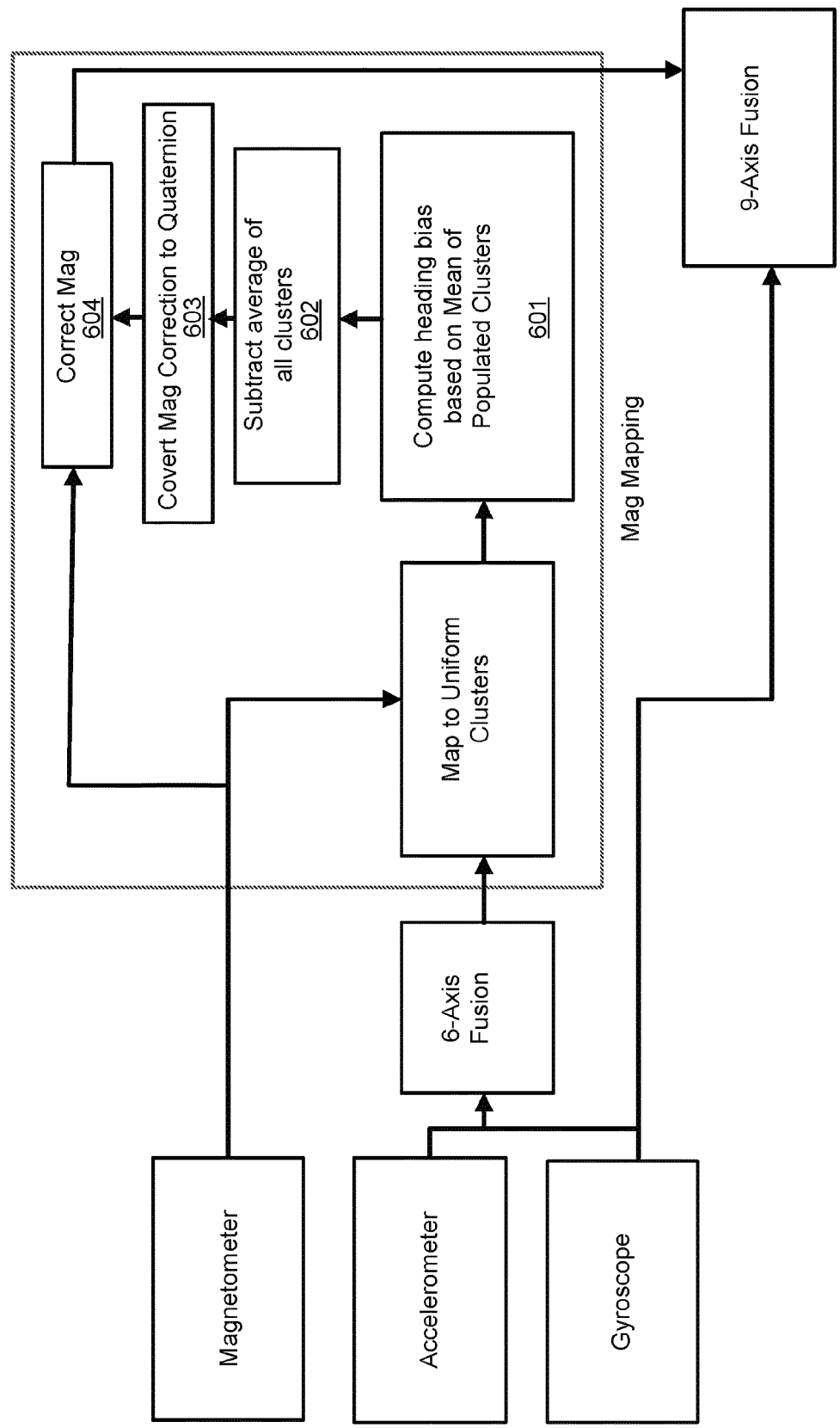
FIG. 13 is a diagram illustrating a sensor fusion system configured for performing magnetometer mapping and/or magnetometer calibration according to embodiments.

FIG. 13 is a diagram illustrating a sensor fusion system configured for performing magnetometer mapping and/or magnetometer calibration according to embodiments.

According to embodiments, a sensor fusion system, such as that shown in FIG. 13, may minimize magnetometer walking and may increase yaw accuracy for a 9-axis sensor fusion algorithm.

A 6-axis fusion may have a slow drift in heading over a long time period, and there may be an overall heading bias that applies to all clusters. According to embodiments, an overall heading bias may be calculated from the average of the heading bias among all the clusters, for example, as shown in FIG. 13. According to embodiments, a true heading bias of each cluster may (e.g., needs to) account for (e.g., may need to subtract) the average of the heading bias, for example, as shown in FIG. 13.

According to embodiments, a first operation 601 is to compute a magnetometer correction based on the closest searched cluster mean azimuth. For example, the magnetometer correction may be equal to the negative value of the duster mean, as shown below in Equation (7.4):

$$correction = -(clusterCenter[smallestIndex]. \\ getMean(\ )). \quad (7.4)$$

According to embodiments, getMean( ) may compute the mean azimuth angle of the chosen clusterCenter.

According to embodiments, a second operation 602 may be to remove the average heading bias from the heading correction for all clusters, as shown below:

$$correction = correction - (\Sigma_k clusterCenter[k].getMean)/ \\ REFERENCE\_Q\_LENGTH.$$

According to embodiments, a third operation 603 may be to convert the magnetometer correction to a quaternion as shown below in Equation (7.5):

$$qCorrect = convertYawtoQ\ (correction) \quad (7.5)$$

According to embodiments, convertYawtoQ (θ) may be used to get the quaternion for a yaw rotation of θ as shown below:

$$convertYawtoQ(\theta) = [\cos(\theta/2)\ 0\ 0\ \sin(\theta/2)].$$

According to embodiments, a fourth operation 604 may be to correct body frame magnetometer data, and feed the corrected body frame magnetometer data into the 9-axis sensor fusion computation block, as shown below in Equation (7.6):

$$magBody_{corrected} = qvrot\ (qCorrect, magIn) \quad (7.6)$$

8. Conclusion

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer readable medium for execution by a computer or processor. Examples of non-transitory computer-readable storage media include, but are not limited to, a read only memory (ROM), random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU 102, UE, terminal, base station, RNC, or any host computer.

Moreover, in the embodiments described above, processing platforms, computing systems, controllers, and other devices containing processors are noted. These devices may contain at least one Central Processing Unit ("CPU") and memory. In accordance with the practices of persons skilled in the art of computer programming, reference to acts and symbolic representations of operations or instructions may be performed by the various CPUs and memories, Such acts and operations or instructions may be referred to as being "executed", "computer executed", or "CPU executed".

One of ordinary skill in the art will appreciate that the acts and symbolically represented operations or instructions include the manipulation of electrical signals by the CPU. An electrical system represents data bits that can cause a resulting transformation or reduction of the electrical signals and the maintenance of data bits at memory locations in a memory system to thereby reconfigure or otherwise alter the CPU's operation, as well as other processing of signals. The memory locations where data bits are maintained are physical locations that have particular electrical, magnetic, optical, or organic properties corresponding to or representative of the data bits. It should be understood that the exemplary embodiments are not limited to the above-mentioned platforms or CPUs and that other platforms and CPUs may support the provided methods.

The data bits may also be maintained on a computer readable medium including magnetic disks, optical disks, and any other volatile (e,g., Random Access Memory ("RAM")) or non-volatile (e.g., Read-Only Memory ("ROM")) mass storage system readable by the CPU. The computer readable medium may include cooperating or interconnected computer readable medium, which exist exclusively on the processing system or are distributed among multiple interconnected processing systems that may be local or remote to the processing system. It is understood that the representative embodiments are not limited to the above-mentioned memories and that other platforms and memories may support the described methods.

In an illustrative embodiment, any of the operations, processes, etc. described herein may be implemented as computer-readable instructions stored on a computer-readable medium. The computer-readable instructions may be executed by a processor of a mobile unit, a network element, and/or any other computing device.

There is little distinction left between hardware and software implementations of aspects of systems. The use of hardware or software is generally (but not always, in that in certain contexts the choice between hardware and software may become significant) a design choice representing cost vs. efficiency tradeoffs. There may be various vehicles by which processes and/or systems and/or other technologies described herein may be affected (e.g., hardware, software, and/or firmware), and the preferred vehicle may vary with the context in which the processes and/or systems and/or other technologies are deployed. For example, if an implementer determines that speed and accuracy are paramount, the implementer may opt for a mainly hardware and/or firmware vehicle. If flexibility is paramount, the implementer may opt for a mainly software implementation. Alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Application Specific Standard Products (ASSPs); Field Programmable Gate Arrays (FPGAs) circuits, any other type of integrated circuit (IC), and/or a state machine.

Although features and elements are provided above in particular combinations, one of ordinary skill in the art will appreciate that each feature or element can be used alone or in any combination with the other features and elements. The present disclosure is not to be limited in terms of the particular embodiments described in this application, which are intended as illustrations of various aspects. Many modifications and variations may be made without departing from its spirit and scope, as will be apparent to those skilled in the art. No element, act, or instruction used in the description of the present application should be construed as critical or essential to the invention unless explicitly provided as such. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods or systems.

It is also to be understood that the terminology used herein is for the purpose of describing particular embodiments only, and is not intended to be limiting. As used herein, when referred to herein, the terms "station" and its abbreviation "STA", "user equipment" and its abbreviation "UE" may mean (i) a wireless transmit and/or receive unit (WTRU), such as described infra; (ii) any of a number of embodiments of a WTRU, such as described infra; (iii) a wireless-capable and/or wired-capable (e.g., tetherable) device configured with, inter alia, some or all structures and functionality of a WTRU, such as described infra; (iii) a wireless-capable and/or wired-capable device configured with less than all structures and functionality of a WTRU, such as described infra; or (iv) the like.

In certain representative embodiments, several portions of the subject matter described herein may be implemented via Application Specific Integrated Circuits (ASICs), Field Programmable Gate Arrays (FPGAs), digital signal processors (DSPs), and/or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein may be distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a CD, a DVD, a digital tape, a computer memory, etc., and a transmission type medium such as a digital and/or an analog communication medium (e.g., a fiber optic cable, a waveguide, a wired communications link, a wireless communication link, etc.).

The herein described subject matter sometimes illustrates different components contained within, or connected with, different other components. It is to be understood that such depicted architectures are merely examples, and that in fact many other architectures may be implemented which achieve the same functionality. In a conceptual sense, any arrangement of components to achieve the same functionality is effectively "associated" such that the desired functionality may be achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable" to each other to achieve the desired functionality, Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, where only one item is intended, the term "single" or similar language may be used. As an aid to understanding, the following appended claims and/or the descriptions herein may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"). The same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B". Further, the terms any of followed by a listing of a plurality of items and/or a plurality of categories of items, as used herein, are intended to include "any of," "any combination of," "any multiple of," and/or "any combination of multiples of" the items and/or the categories of items, individually or in conjunction with other items and/or other categories of items. Moreover, as used herein, the term "set" or "group" is intended to include any number of items, including zero. Additionally, as used herein, the term "number" is intended to include any number, including zero.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein may be readily broken down into a lower third, middle third and upper third, etc. As will also be understood by one skilled in the art all language such as "up to", "at least", "greater than", "less than", and the like includes the number recited and refers to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

Moreover, the claims should not be read as limited to the provided order or elements unless stated to that effect. In addition, use of the terms "means for" in any claim is intended to invoke 35 U.S.C. § 112(f) or means-plus-function claim format, and any claim without the terms "means for" is not so intended.

Although the invention is illustrated and described herein with reference to specific embodiments, the invention is not intended to be limited to the details shown. Rather, various modifications may be made in the details within the scope and range of equivalents of the claims and without departing from the invention.

Throughout the disclosure, one of skill understands that certain representative embodiments may be used in the alternative or in combination with other representative embodiments.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer readable medium for execution by a computer or processor. Examples of non-transitory computer-readable storage media include, but are not limited to, a read only memory (ROM), random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WRTU, UE, terminal, base station, RNC, or any host computer.

Moreover, in the embodiments described above, processing platforms, computing systems, controllers, and other devices containing processors are noted. These devices may contain at least one Central Processing Unit ("CPU") and memory. In accordance with the practices of persons skilled in the art of computer programming, reference to acts and symbolic representations of operations or instructions may be performed by the various CPUs and memories. Such acts and operations or instructions may be referred to as being "executed", "computer executed", or "CPU executed".

One of ordinary skill in the art will appreciate that the acts and symbolically represented operations or instructions include the manipulation of electrical signals by the CPU. An electrical system represents data bits that can cause a resulting transformation or reduction of the electrical signals and the maintenance of data bits at memory locations in a memory system to thereby reconfigure or otherwise alter the CPU's operation, as well as other processing of signals. The memory locations where data bits are maintained are physical locations that have particular electrical, magnetic, optical, or organic properties corresponding to or representative of the data bits.

The data bits may also be maintained on a computer readable medium including magnetic disks, optical disks, and any other volatile (e.g., Random Access Memory ("RAM")) or non-volatile ("e,g., Read-Only Memory ("ROM")) mass storage system readable by the CPU. The computer readable medium may include cooperating or interconnected computer readable medium, which exist exclusively on the processing system or are distributed among multiple interconnected processing systems that may be local or remote to the processing system. It is understood that the representative embodiments are not limited to the above-mentioned memories and that other platforms and memories may support the described methods.

No element, act, or instruction used in the description of the present application should be construed as critical or essential to the invention unless explicitly described as such. In addition, as used herein, the article "a" is intended to include one or more items. Where only one item is intended, the term "one" or similar language is used. Further, the terms "any of" followed by a listing of a plurality of items and/or a plurality of categories of items, as used herein, are intended to include "any of," "any combination of," "any multiple of," and/or "any combination of multiples of" the items and/or the categories of items, individually or in conjunction with other items and/or other categories of items. Further, as used herein, the term "set" is intended to include any number of items, including zero. Further, as used herein, the term "number" is intended to include any number, including zero.

Moreover, the claims should not be read as limited to the described order or elements unless stated to that effect. In addition, use of the term "means" in any claim is intended to invoke 35 U.S.C. § 112(f), and any claim without the word "means" is not so intended.

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Application Specific Standard Products (ASSPs); Field Programmable Gate Arrays (FPGAs) circuits, any other type of integrated circuit (IC), and/or a state machine.

A processor in association with software may be used to implement a radio frequency transceiver for use in a wireless transmit receive unit (WRTU), user equipment (UE), terminal, base station, Mobility Management Entity (MME) or Evolved Packet Core (EPC), or any host computer. The WRTU may be used m conjunction with modules, implemented in hardware and/or software including a Software Defined Radio (SDR), and other components such as a camera, a video camera module, a videophone, a speakerphone, a vibration device, a speaker, a microphone, a television transceiver, a hands free headset, a keyboard, a Bluetooth® module, a frequency modulated (FM) radio unit, a Near Field Communication (NFC) Module, a liquid crystal display (LCD) display unit, an organic light-emitting diode (OLED) display unit, a digital music player, a media player, a video game player module, an Internet browser, and/or any Wireless Local Area Network (WLAN) or Ultra Wide Band (UWB) module.

Although the invention has been described in terms of communication systems, it is contemplated that the systems may be implemented in software on microprocessors/general purpose computers (not shown). In certain embodiments, one or more of the functions of the various components may be implemented in software that controls a general-purpose computer.

In addition, although the invention is illustrated and described herein with reference to specific embodiments, the invention is not intended to be limited to the details shown. Rather, various modifications may be made in the details within the scope and range of equivalents of the claims and without departing from the invention.

9. REFERENCES INCORPORATED HEREIN BY REFERENCE

[1] United States Patent Application Pub. No. 2013/0238268 A1;
[2] United States Patent Application Pub. No. 2013/0245984 A1; and
[3] L. Lovisolo and E. A. B. da Silva; "Uniform distribution of points on a hyper-sphere with applications to vector bit-plane encoding"; IEEE Proc. Vision Image Signal Process, 2001, pp. 148,187-193.

What is claimed:

1. A method of determining a heading of an object bearing a magnetometer, the method comprising:
    obtaining a plurality of magnetic field measurements at a plurality of different orientations from the magnetometer, wherein the plurality of different orientations originate from a rotation of the object around a gravitational axis;
    determining a least squares solution for two-dimensional scale, skew, and offset of the magnetometer based on those measurements;
    applying the two-dimensional scale, skew, and offset to the magnetic field measurements of the magnetometer to generate calibrated magnetometer magnetic field measurements; and
    determining the heading of the object based on the calibrated magnetometer magnetic field measurements.

2. The method of claim 1 wherein the determining the least squares solution for two-dimensional scale, skew, and offset comprises determining the best fit for k in $$T*k = u$$

where $$t_n = [\, h_{nx}^2 \quad 2h_{nx}h_{ny} \quad -2h_{nx} \quad -2h_{ny} \quad 1\,],$$

$$T = \begin{bmatrix} t_1 \\ \vdots \\ t_N \end{bmatrix},$$

$$k = \begin{bmatrix} \dfrac{q_1}{q_2} & \dfrac{q_3}{q_2} & \dfrac{q_4}{q_2} & \dfrac{q_5}{q_2} & \dfrac{\|b\|^2 - 1}{q_2} \end{bmatrix}',$$

$$u_n = -h_{ny}^2, \quad u = \begin{bmatrix} u_1 \\ \vdots \\ u_N \end{bmatrix},$$

$$(I+D)'(I+D) = \begin{bmatrix} p_x^2 + p_{xy}^2 & p_{xy}(p_x + p_y) \\ p_{xy}(p_x + p_y) & p_y^2 + p_{xy}^2 \end{bmatrix} = \begin{bmatrix} q_1 & q_3 \\ q_3 & q_2 \end{bmatrix},$$

and $$(I+D) \cdot b = \begin{bmatrix} b_x p_x + b_y p_{xy} \\ b_y p_y + b_x p_{xy} \end{bmatrix} = \begin{bmatrix} q_4 \\ q_5 \end{bmatrix}.$$

and where
$h_{nx}$ is a body frame magnetic field measured by the magnetometer in direction x at time n;
$h_{ny}$ is the body frame magnetic field measured by the magnetometer in direction y at time n;

$$(I+D) = \begin{bmatrix} p_x & p_{xy} \\ p_{xy} & p_y \end{bmatrix}$$

is a gain and skew matrix of the magnetometer wherein x and y represent two orthogonal directional axes;
$p_x$, and $p_y$ represent gain in the x and y axes, respectively, and $p_{xy}$ represents skew in the x-y plane; and
$b = [b_x \; b_y]'$ is an offset of the magnetometer.

3. The method of claim 2 wherein, after obtaining the best fit, $\hat{k} = [k_1 \; k_2 k_3 \; k_4 \; k_5]$, let $$\Lambda = \begin{bmatrix} k_1 & k_2 \\ k_2 & 1 \end{bmatrix},$$

$$q_2 = \left( [\, k_3 \quad k_4 \,] \cdot \Lambda^{-1} \cdot \begin{bmatrix} k_3 \\ k_4 \end{bmatrix} - k_5 \right)^{-1},$$

$$(I+D) = \sqrt{q_2} \cdot \Lambda^{\frac{1}{2}} \text{ and}$$

$$b = \sqrt{q_2} \cdot \Lambda^{-\frac{1}{2}} \cdot \begin{bmatrix} k_3 \\ k_4 \end{bmatrix}.$$

4. The method of claim 1 further comprising:
    calculating at least one of (a) a mean square error of a residual after applying the calibration, (b) a magnitude difference of the calibrated field relative to the ellipsoid, and (c) a tilt of the device, as a reliability indicator of the determined heading; and
    determining an estimated reliability of the determined heading based on the reliability indicator.

5. The method of claim 1 wherein the least square solution assumes that skew in the magnetometer is zero.

6. The method of claim 5 wherein the determining the least squares solution for two-dimensional scale and offset comprises determining the best fit for k in $$T*k = u$$

$$t_n = [\, h_{nx}^2 \quad -2h_{nx} \quad -2h_{ny} \quad 1\,],$$

$$T = \begin{bmatrix} t_1 \\ \vdots \\ t_N \end{bmatrix},$$

$$k = \left[ \left(\dfrac{p_x}{p_y}\right)^2 \quad \dfrac{b_x p_x}{p_y^2} \quad \dfrac{b_y}{p_y} \quad \dfrac{\|b\|^2 - 1}{p_y^2} \right]', \text{ and}$$

$$u_n = -h_{ny}^2, \quad u = \begin{bmatrix} u_1 \\ \vdots \\ u_N \end{bmatrix}.$$

where
$h_{nx}$ is a body frame magnetic field measured by the magnetometer in direction x at time n;
$h_{ny}$ is the body frame magnetic field measured by the magnetometer in direction y at time n;
$p_x$ and $p_y$ are gains of the magnetometer in the x and y axes; and
$b = [b_x \; b_y]'$ is an offset of the magnetometer in the x and y axes.

7. The method of claim 6 wherein, after obtaining the best fit, $\hat{k}=[k_1\ k_2 k_3\ k_4]$, let $$p_y = \left(k_3^2 + \frac{k_2^2}{k_1} - k_4\right)^{-1/2},$$

$$p_x = \sqrt{k_1} \cdot p_y, \text{ and}$$

$$b = [k_2/\sqrt{k_1}\ \ k_3]' \cdot p_y.$$

8. The method of claim 1 wherein the least square solution solves for a one-dimensional scale, a two-dimensional offset, and no skew.

9. The method of claim 8 wherein the determining the least squares solution for one-dimensional scale and two-dimensional offset comprises determining the best fit for k in $$T * k = u$$

where $$r_n = [\,2h_{nx}\ \ 2h_{ny}\ \ 1\,],$$

$$T = \begin{bmatrix} t_1 \\ \vdots \\ t_N \end{bmatrix},$$

$$k = \left[\frac{b_x}{p}\ \ \frac{b_y}{p}\ \ \frac{1-\|b\|^2}{p^2}\right]',$$

$$u_n = h_{nx}^2 + h_{ny}^2,\ u = \begin{bmatrix} u_1 \\ \vdots \\ u_N \end{bmatrix}.$$

where $h_{nx}$ is a body frame magnetic field measured by the magnetometer in direction x at time n;
$h_{ny}$ is the body frame magnetic field measured by the magnetometer in direction y at time n;
p is the gain of the magnetometer in the x and y axes; and
b=[$b_x$ $b_y$]' is the offset of the magnetometer in x and y axes.

10. The method of claim 9 wherein, after obtaining the best fit, $\hat{k}=[k_1\ k_2 k_3]$, let $$p=(k_1^2+k_2^2+k_3)^{-1/2}, \text{ and}$$

$$b=[k_1 k_2]'\cdot p.$$

11. The method of claim 1 wherein the object further bears at least one gyroscope and wherein determining the least squares solution for two-dimensional scale, skew, and offset comprises determining the best fit for $M=[M^x\ M^y]$ in $$H \cdot M^x = Q^x,$$

$$H \cdot M^y = Q^y,$$

where $$H = \begin{bmatrix} \tilde{h}_1 \\ \vdots \\ \tilde{h}_N \end{bmatrix},\ \tilde{h}_n = [\,h_{nx}\ \ h_{ny}\ \ -1\,],$$

-continued $$M = \begin{bmatrix} (I+D)\cdot R_0 \\ b'\cdot R_0 \end{bmatrix} = \begin{bmatrix} M_{11} & M_{12} \\ M_{21} & M_{22} \\ M_{31} & M_{32} \end{bmatrix},$$

$$M^x = \begin{bmatrix} M_{11} \\ M_{21} \\ M_{31} \end{bmatrix},\ M^y = \begin{bmatrix} M_{12} \\ M_{22} \\ M_{32} \end{bmatrix},$$

$$Q^x = \begin{bmatrix} h_x^{q_1} \\ \vdots \\ h_x^{q_N} \end{bmatrix},\ Q^y = \begin{bmatrix} h_y^{q_1} \\ \vdots \\ h_y^{q_N} \end{bmatrix}.$$

and where
$h_{nx}$ is a body frame magnetic field measured by the magnetometer in direction x at time n;
$h_{ny}$ is the body frame magnetic field measured by the magnetometer in direction y at time n;

$$h^{q_n} = \begin{bmatrix} h_x^{q_n} \\ h_y^{q_n} \end{bmatrix} = R(q_n)\cdot h_0$$

is the magnetic vector predicted by the at least one gyroscope at time n;
$R(q_n)$ is a 2-D rotation matrix from an initial orientation to a current orientation $q_n$.
$h_0$ is the magnetic field in earth frame;
$R_0$ is a 2-D rotation matrix from a user frame to the initial orientation;
(I+D) is a gain and skew matrix of the magnetometer wherein x and y represent two orthogonal directional axes;
b=[$b_x$ $b_y$]' is an offset of the magnetometer.

12. The method of claim 11 further comprising:
after determining the least square solution M, performing a singular value decomposition to the first two rows of matrix M $$M_{2\times 2}=W\Sigma V^*,$$

Then $$(I+D)=W\Sigma W^*,$$

$$R_0=WV^*,$$

$$b=R_0*M_3'$$

wherein $M_3$ is a third row of matrix M.

13. The method of claim 11 further comprising:
applying a forgetting factor to reduce the impact of older samples.

14. The method of claim 1 wherein the least squares solution is a recursive least squares solution.

15. A method of determining a two-dimensional heading of an object bearing a magnetometer, and accelerometer, and a gyroscope, the method comprising:
obtaining a plurality of magnetic field measurements at a plurality of different orientations from the magnetometer;
determining a least squares solution for two-dimensional scale, skew, and offset of the magnetometer based on those measurements;
applying the two-dimensional scale, skew, and offset to the magnetic field measurements of the magnetometer to generate calibrated magnetometer magnetic field measurements;

determining a first heading estimate of the object based on the calibrated magnetometer magnetic field measurements;

determining a second heading estimate of the object based on accelerometer and gyroscope data; and determining the two-dimensional heading of the object by fusing the first heading estimate with the second heading estimate.

16. The method of claim 15 wherein the fusing comprises: assigning a weight to each of the first heading and the second heading, wherein the assigned weights are based on an estimated reliability of the first heading.

17. The method of claim 16 wherein the determining an estimated reliability of the first heading estimate comprises calculating at least one of (a) a mean square error of a residual after applying the calibration, (b) a magnitude difference of the calibrated field relative to the ellipsoid as a reliability indicator of the determined heading, and (c) a tilt of the device.

18. A method of determining a two-dimensional heading of an object bearing a magnetometer, and accelerometer, and a gyroscope, the method comprising:

obtaining a plurality of magnetic field measurements at a plurality of different orientations from the magnetometer, wherein the plurality of different orientations originate from a rotation of the object around a gravitational axis;

determining a least squares solution for two-dimensional scale, skew, and offset of the magnetometer based on those measurements;

applying the two-dimensional scale, skew, and offset to the magnetic field measurements of the magnetometer to generate calibrated magnetometer magnetic field measurements;

determining an orientation of the object based on a fusion of the calibrated magnetometer magnetic field measurements and measurements from the accelerometer and gyroscope; and determining the two-dimensional heading of the object based on the determined orientation.

* * * * *